(12) United States Patent
Kothandapani et al.

(10) Patent No.: US 12,074,099 B2
(45) Date of Patent: Aug. 27, 2024

(54) MICROELECTRONICS PACKAGE ASSEMBLIES AND PROCESSES FOR MAKING

(71) Applicant: Materion Corporation, Mayfield Heights, OH (US)

(72) Inventors: Ramesh Kothandapani, Singapore (SG); Christopher Johnson, Mayfield Heights, OH (US); ZhenWei Tee, Mayfield Heights, OH (US); Noel De Leon, Mayfield Heights, OH (US); SinLi Tan, Singapore (SG)

(73) Assignee: Materion Corporation, Mayfield Heights, OH (US)

( * ) Notice: Subject to any disclaimer, the term of this patent is extended or adjusted under 35 U.S.C. 154(b) by 65 days.

(21) Appl. No.: 17/737,564

(22) Filed: May 5, 2022

(65) Prior Publication Data
US 2022/0359351 A1    Nov. 10, 2022

Related U.S. Application Data

(60) Provisional application No. 63/185,768, filed on May 7, 2021.

(51) Int. Cl.
| H01L 23/495 | (2006.01) |
| H01L 21/48 | (2006.01) |
| H01L 23/373 | (2006.01) |
| H01L 23/66 | (2006.01) |

(52) U.S. Cl.
CPC .... *H01L 23/49568* (2013.01); *H01L 21/4828* (2013.01); *H01L 21/4842* (2013.01); *H01L 23/3732* (2013.01); *H01L 23/49558* (2013.01); *H01L 23/49562* (2013.01); *H01L 23/49582* (2013.01); *H01L 23/49586* (2013.01);
(Continued)

(58) Field of Classification Search
CPC ............ H01L 21/4828; H01L 21/4842; H01L 23/49582; H01L 23/49568
USPC ........................................................ 257/675
See application file for complete search history.

(56) References Cited

U.S. PATENT DOCUMENTS

| 8,975,176 B2 | 3/2015 | Kothandapani |
| 10,211,115 B2 | 2/2019 | Kothandapani |
| 2004/0229457 A1 | 11/2004 | Chan et al. |

(Continued)

FOREIGN PATENT DOCUMENTS

WO    2017/201260 A1    11/2017

OTHER PUBLICATIONS

Invitation to Pay Additional Fees for International Application No. PCT/US2022/027846 mailed Sep. 9, 2022, 10 pages.

*Primary Examiner* — Quoc D Hoang
(74) *Attorney, Agent, or Firm* — Cozen O'Connor

(57) ABSTRACT

A microelectronics package assembly and process of making same are disclosed. The flange has an upper surface and a first coating disposed on the upper surface of the flange. The insulator has a bottom surface for mounting onto the flange and an upper surface opposite the bottom surface. A second coating is disposed on the bottom surface of the insulator and a third coating disposed on the upper surface of the insulator. The first coating, the second coating, and the third coating each have a thickness of less than or equal to 1 micron. At least one of the first coating, the second coating, and the third coating is applied via at least one of physical vapor deposition, atomic deposition, or chemical deposition.

20 Claims, 12 Drawing Sheets

(52) U.S. Cl.
CPC ...... *H01L 23/66* (2013.01); *H01L 2223/6616* (2013.01); *H01L 2223/6683* (2013.01)

(56) References Cited

U.S. PATENT DOCUMENTS

2014/0103506 A1* 4/2014 Su ........................... H01L 24/16
                                                                 257/675
2017/0069560 A1   3/2017 Koba et al.
2022/0302003 A1*  9/2022 Pan ..................... H01L 21/4857

* cited by examiner

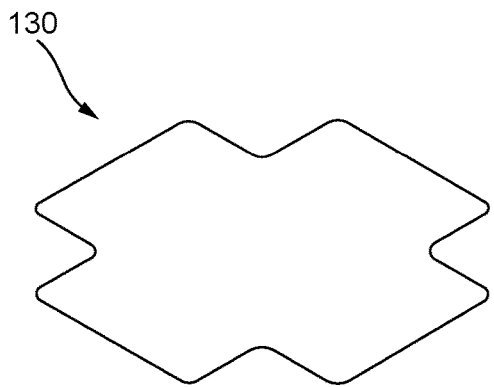
FIG. 11
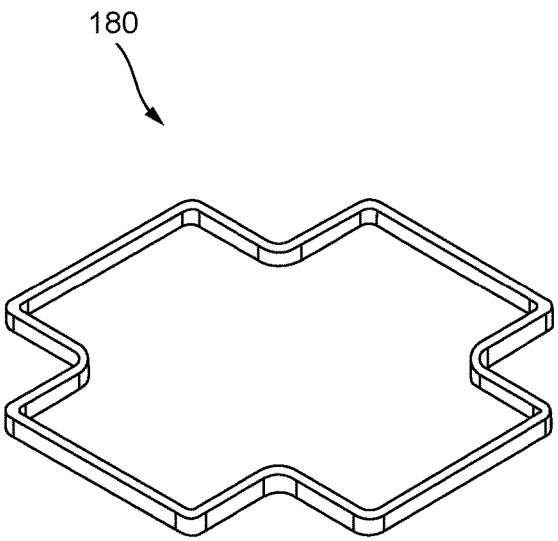
FIG. 14
FIG. 12
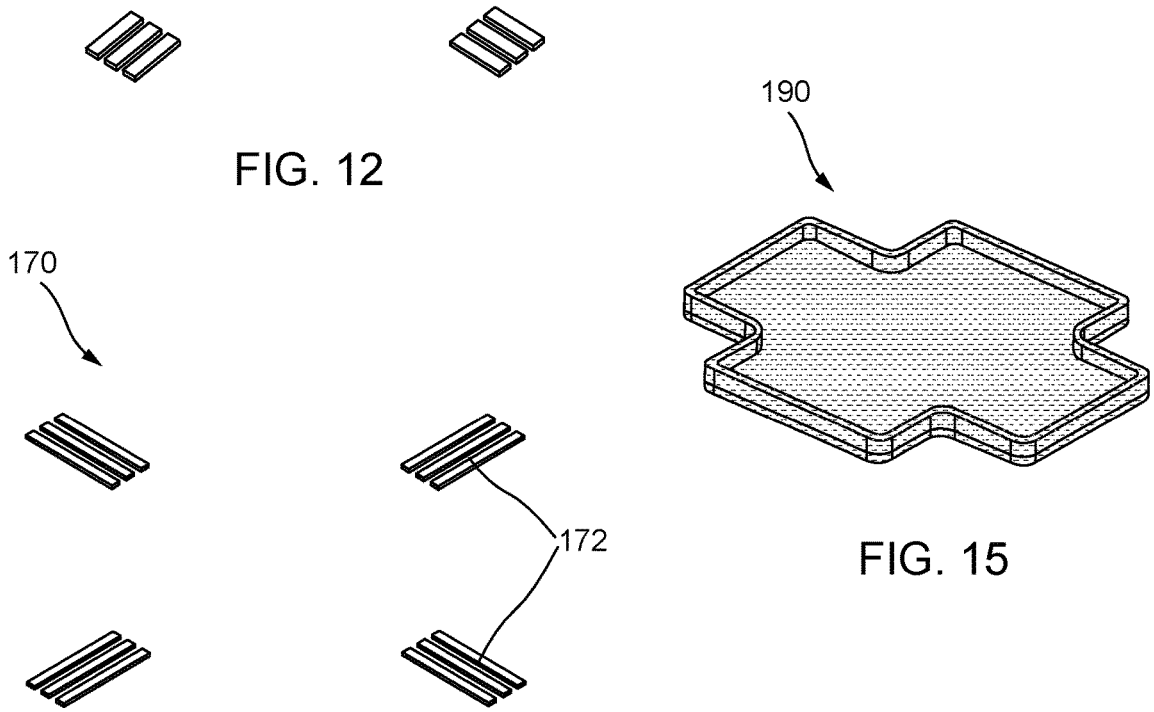
FIG. 13
FIG. 15

MICROELECTRONICS PACKAGE ASSEMBLIES AND PROCESSES FOR MAKING

CROSS REFERENCE TO RELATED APPLICATIONS

This application claims priority to U.S. Provisional Patent Application No. 63/185,768 filed May 7, 2021, which is incorporated herein by reference.

FIELD

The present disclosure relates to microelectronics package assemblies, and processing methods for making package assemblies for high thermal dissipating applications, such as high frequency radio frequency transistors.

BACKGROUND

Radio frequency package assemblies having air cavities compatible with die attach materials have uses in Si LDMOS (Laterally Diffused Metal Oxide) Transistors, Doherty Amplifiers, GaAs FETs, GaAs MMICs, GaN FETs, and GaN MMICs. These packages include thermal spreading or thermally conductive devices that can carry RF signals via leads. Such packages can be used to attach RF emitting transistors and resistors for radio waves for telecommunication purposes.

Semiconductor dies, in particular gallium nitride (GaN), have evolved with much higher power densities than previous transistor technologies. The higher power densities generate more heat in a smaller area due to internal dissipation. The smaller area of dissipation reduces the cross sectional area of the heat dissipation path, which increases the junction temperatures. The junction temperature is determined by the power dissipation times the thermal impedance.

Performance of a radio-frequency integrated circuit can be dramatically affected by the package environment. Demand for ever-changing and increasing requirements for high-speed digital and radio frequency applications requires packaging for the die attachment that takes into consideration RF performance in addition to mechanical concerns. Packaging must be able to withstand maximum junction operating temperatures for reliable operation.

However, conventional package assemblies produced have lower thermal dissipation properties and limited RF signal strength and power output. In addition, conventional package assemblies include more processing steps and demonstrate lower yields due to processing limitations such as outgassing during plating steps, which introduces organics and may result in lower RF performance than required for some applications, e.g. 5G applications. Organics during processing negatively impact sheer strength between components, e.g. between the flange and the insulator.

While methods for making package assemblies are available, the need exists for package assemblies and processes for making that provides improvements in sheer strength, RF performance, and yield, while providing high thermal dissipation and high frequency.

SUMMARY

In one embodiment, the disclosure relates to a microelectronics package assembly. The assembly comprises a flange having an upper surface and a first coating disposed on the upper surface of the flange. The assembly includes an insulator for partially enclosing a die, the insulator having a bottom surface for mounting onto the flange and an upper surface opposite the bottom surface, a second coating disposed on the bottom surface of the insulator, and a third coating disposed on the upper surface of the insulator. The first coating, the second coating, and the third coating each have a thickness of less than or equal to 1 micron. At least one of the first coating, the second coating, and the third coating is applied via at least one of physical vapor deposition, atomic deposition, or chemical deposition. In one embodiment, the microelectronics package assembly is useful with (GaN) RF power transistors delivering over 5 W at frequencies between 2 and 10 GHz. The microelectronics package assemblies herein are also useful with 5G wireless amplifiers operating at very high frequencies, e.g., greater than 3 GHz.

At least one of the first coating, the second coating, and the third coating may include titanium, copper, alloys thereof, sublayers thereof, or combinations thereof. Each of the first coating, the second coating, and the third coating may be devoid of nickel.

The insulator may include sapphire, alumina ($Al_2O_3$), beryllia (BeO), aluminum nitride (AlN), zirconia toughened alumina (ZTA), silicon carbide (SiC), magnesium silicon carbide (Mg—SiC), silicon nitride ($Si_3N_4$), or combinations thereof. In some embodiments, the insulator is alumina ($Al_2O_3$) having a purity of greater than or equal to 96%. The insulator may include a plurality of through holes (or vias) through a thickness of the insulator. A braze layer onto the upper surface of the insulator may penetrate the through holes to bond the insulator to the flange.

The flange may be a high thermal conductive material having a thermal conductivity ranging from 140 to 2000 W/(mK) at room temperature and a coefficient of thermal expansion (CTE) ranging from 2.3 ppm/K to 17.5 ppm/K. The flange may include a diamond based composite, Cu—CuMo—Cu (CPC), copper tungsten (CuW), Cu—Mo—Cu (CMC), Cu, or combinations thereof.

The microelectronics package assembly may further include a first conductive alloy preform adhering the insulator to the flange. The first conductive alloy preform contacts the first coating and the second coating. The microelectronics package assembly may further include one or more leads, wherein at least one of the one or more leads has a width of less than or equal to 0.35 microns. The microelectronics package assembly may further include a second conductive alloy preform for adhering the one or more leads to the insulator, wherein the second conductive alloy preform contacts the third coating and the one or more leads. At least one of the first and second conductive alloy preforms is a silver copper (Ag—Cu) alloy or a gold tin (Au—Sn) alloy.

The one or more leads may include at least one of: an alloy having a chemical composition of from 30 wt % to 80 wt % nickel (Ni) and balance iron (Fe), a thermal conductivity ranging from 9.5 W/(mK) to 11.5 W/(mK), and a spacing distance between at least two of the one or more leads of less than or equal to 0.35 microns.

The microelectronics package assembly may further include a cover to form a cavity with the insulator for partially enclosing the die. The cover may be alumina ($Al_2O_3$), aluminum nitride (AlN), liquid crystal polymer (LCP), or combinations thereof.

In another embodiment, a process for making a microelectronics package assembly is disclosed. The process includes depositing a first coating having a thickness of less than or equal to 1 micron on opposing surfaces of a flange and an insulator, wherein the flange is a high thermal conductive material having a thermal conductivity ranging from 140 to 2000 W/(mK) at room temperature and a coefficient of thermal expansion (CTE) ranging from 2.3 ppm/K to 17.5 ppm/K. The process includes positioning a first conductive alloy preform between the coated surfaces of the flange and the insulator. The process includes depositing a second coating on at least a portion of an upper surface of the insulator to a thickness of less than or equal to 1 micron to form at least a partially coated upper surface. The process includes directly bonding one or more leads to the at least partially coated upper surface using a second conductive alloy preform to allow the one or more leads to have a narrow width of less than or equal to 0.35 microns. The process includes adhering the first conductive preform to the insulator and the flange and the second conductive preform to the insulator and the leads at a temperature of greater than or equal to 850° C. Depositing at least one of a first coating and a second coating includes physical vapor deposition, atomic deposition, or chemical deposition.

The process includes the first coating may comprise titanium, copper, alloys thereof, sublayers thereof, or combinations thereof, and the second coating comprises titanium, copper, alloys thereof, sublayers thereof.

Depositing at least one of the first coating and the second coating may include depositing two or more sublayers, wherein a first sublayer is titanium and a second sublayer is copper, and wherein the first sublayer is from 15% to 35% of a total coating thickness and the second sublayer is from 65% to 85% of the total coating thickness.

The process may further include attaching a cover to form a cavity for a die wherein the cover includes a liquid crystal polymer, wherein the cover is alumina ($Al_2O_3$), aluminum nitride (AlN), liquid crystal polymer (LCP), or combinations thereof.

The process may further include forming a plurality of through holes through a thickness of the insulator prior to coating, and wherein after depositing a second coating the process includes brazing a layer onto the upper surface of the insulator to penetrate the through holes to bond the insulator to the flange.

The process may further include depositing a second coating includes depositing onto an entirety of the upper surface of the insulator and further includes laser removal of the second coating selectively to form circuitry.

In another embodiment, the disclosure relates to a microelectronics package assembly. The package assembly comprises a flange, a first coating, an insulator, a second coating, and a conductive alloy preform. The flange has an upper surface, wherein the flange is a high thermal conductive material having a thermal conductivity ranging from 140 to 2000 W/(mK) at room temperature and a coefficient of thermal expansion (CTE) ranging from 2.3 ppm/K to 17.5 ppm/K. The first coating is disposed on the upper surface and has a thickness of less than or equal to 1 micron. The insulator partially encloses and mounting a die, and the insulator has a having a bottom surface. The second coating is disposed on the bottom surface of the insulator. The conductive alloy preform adheres the insulator to the flange. The conductive alloy preform contacts the first coating and second coating.

In another embodiment, a microelectronics package assembly comprises a flange having an insulator mounted thereon. The insulator has an upper surface. A first coating is disposed on the upper surface of the insulator and has a thickness of less than or equal to 1 micron. The package assembly further comprises one or more leads, wherein at least one of the one or more leads has a width of less than or equal to 0.35 microns. A conductive alloy preform adheres the one or more leads to the insulator. The conductive alloy preform contacts the first coating and the one or more leads.

In another embodiment, the disclosure relates to a microelectronics package assembly. The package assembly comprises a flange, a lead frame, and a cover. The flange includes an insulator and a die mounted thereon. The insulator may partially enclose the die. The lead frame includes a plurality of leads surrounding the die on the surface of the insulator opposing the flange. The cover comprises a liquid crystal polymer to form a cavity for the die. The cover is adhered to the lead frame by a non-conductive adhesive.

In yet another embodiment, a microelectronics package assembly comprises a flange, a first coating, an insulator, a second coating, a first conductive alloy preform, a third coating, a lead frame, a second conductive alloy preform, and a cover. The flange has an upper surface and the flange is a high thermal conductive material having a thermal conductivity ranging from 140 to 2000 W/(mK) at room temperature and a coefficient of thermal expansion (CTE) ranging from 2.3 ppm/K to 17.5 ppm/K. The first coating is disposed on the upper surface of the flange and has a thickness of less than or equal to 1 micron. The insulator may be for partially enclosing and mounting a die. The insulator has a bottom surface opposing the flange and an upper surface. The second coating is disposed on the bottom surface of the insulator and has a thickness of less than or equal to 1 micron. The first conductive alloy preform adheres the insulator to the flange. The conductive alloy preform contacts the first and second coatings. The third coating is disposed on a portion of the upper surface of the insulator and has a thickness of less than or equal to 1 micron. The third coating may be the same as the second coating. The lead frame includes a plurality of leads configured to surround the die on the upper surface of the insulator. The second conductive alloy preform adheres the lead frame to the insulator. The second conductive alloy preform contacts the third coating and the plurality of leads. The cover comprises a liquid crystal polymer to form a cavity for the die. The cover is adhered to the lead frame by a non-conductive adhesive.

In one aspect, the disclosure relates to a process for making a microelectronics package assembly. The process comprises depositing a coating having a thickness of less than or equal to 1 micron on opposing surfaces of a flange and an insulator, positioning a conductive alloy preform between the coated surfaces of the flange and the insulator; and adhering the conductive alloy preform to the flange and the insulator at a temperature of greater than or equal to 850° C. The flange is a high thermal conductive material having a thermal conductivity ranging from 140 to 2000 W/(mK) at room temperature and a coefficient of thermal expansion (CTE) ranging from 2.3 ppm/K to 17.5 ppm/K.

In another aspect, a process for attaching leads to a microelectronics package assembly comprises mounting an insulator on a flange, depositing a coating on a portion of the upper surface of the insulator to a thickness of less than or equal to 1 micron; and directly bonding one or more leads to the coated upper surface using a conductive alloy preform to allow the one or more leads to have a narrow width of less than or equal to 0.35 microns. The surface opposing the flange is an upper surface of the insulator.

In another aspect, the disclosure relates to a process for covering a microelectronics package assembly. The process comprises mounting an insulator on a flange, forming a lead frame including a plurality of leads configured to surround the die on the surface of the insulator opposing the flange; and forming a cavity for the die by adhering a liquid crystal polymer cover to the lead frame by a non-conductive adhesive. A die may be mounted to the flange or the insulator.

In yet another aspect, a process for making a microelectronics package assembly comprises depositing a first coating having a thickness of less than or equal to 1 micron on opposing surfaces of a flange and an insulator. The flange is a high thermal conductive material having a thermal conductivity ranging from 140 to 2000 W/(mK) at room temperature and a coefficient of thermal expansion (CTE) ranging from 2.3 ppm/K to 17.5 ppm/K. The process includes positioning a first conductive alloy preform between the coated surfaces of the flange and the insulator. The process further includes depositing a second coating on a portion of the upper surface of the insulator to a thickness of less than or equal to 1 micron to form a partially coated upper surface, directly bonding one or more leads to the partially coated upper surface using a second conductive alloy preform to allow the one or more leads to have a narrow width of less than or equal to 0.35 microns, and adhering the first conductive preform to the insulator and the flange and the second conductive preform to the insulator and the leads at a temperature of greater than or equal to 850° C. The process may include attaching a cover comprising a liquid crystal polymer to form a cavity for a die. The cover is adhered to the lead frame by a non-conductive adhesive.

In some embodiments, the flange is a high thermal conductive material having a thermal conductivity ranging from 140 to 650 W/(mK) at room temperature and a CTE ranging from 5.5 ppm/K to 17.5 ppm/K. The flange may be a high thermal conductive material having a thermal conductivity ranging from 140 to 400 W/(mK) at room temperature and a CTE ranging from 5.5 ppm/K to 17.5 ppm/K. The flange may be a high thermal conductive material having a thermal conductivity ranging from 500 to 600 W/(mK) at room temperature and a CTE ranging from 6.0 ppm/K to 10.5 ppm/K.

In some embodiments, the flange includes a diamond based composite, Cu—CuMo—Cu (CPC), copper tungsten (CuW), Cu—Mo—Cu (CMC), Cu, or combinations thereof. The flange may include Cu—CuMo—Cu (CPC), copper tungsten (CuW), Cu—Mo—Cu (CMC), Cu, or combinations thereof. The flange may include a copper diamond composite or a silver diamond composite.

In some embodiments, at least one of the first and second coatings includes titanium, copper, alloys thereof, or combinations thereof. At least one of the first and second coatings may be applied via physical vapor deposition (PVD). The first and second coatings may be devoid of nickel.

In some embodiments, at least one of the first and second conductive alloy preforms is a solder alloy. At least one of the first and second conductive alloy preforms may be a silver copper (Ag—Cu) alloy or a gold tin (Au—Sn) alloy.

In some embodiments, the insulator includes sapphire, alumina ($Al_2O_3$), beryllia (BeO), aluminum nitride (AlN), zirconia toughened alumina (ZTA), silicon carbide (SiC), magnesium silicon carbide (Mg—SiC), silicon nitride ($Si_3N_4$), or combinations thereof. The insulator may include sapphire, alumina ($Al_2O_3$), aluminum nitride (AlN), or combinations thereof. The insulator may be alumina ($Al_2O_3$) having a purity of greater than or equal to 96%. The insulator may include a plurality of through holes through a thickness of the insulator. The plurality of through holes may be configured in a pattern along a peripheral area of the insulator. The insulator may further include a nickel plate over the coated bottom and upper surfaces. The nickel plate may have a thickness of from 1.0 to 3.5 microns.

In some embodiments, the one or more leads include an alloy of iron, nickel, or combinations thereof. The one or more leads may include an alloy having a chemical composition of from 30 wt % to 80 wt % nickel (Ni) and balance iron (Fe). The one or more leads may have a thermal conductivity ranging from 9.5 W/(mK) to 11.5 W/(mK). At least two of the one or more leads may have a spacing distance of less than or equal to 0.35 microns.

In some embodiments, the assembly further includes a cover to form a cavity for the die. The cover may be alumina ($Al_2O_3$), aluminum nitride (AlN), liquid crystal polymer (LCP), or combinations thereof. The cover may include a non-conductive adhesive configured to provide a seal.

In some embodiments, the assembly further includes a die such as gallium nitride (GaN), gallium arsenide (GaAs), silicon (Si), or combinations thereof.

In some aspects, the process includes depositing a coating includes physical vapor deposition, atomic deposition, or chemical deposition. Depositing a coating may include physical vapor deposition. Depositing a coating may include depositing two or more sublayers. A first sublayer may be titanium and a second sublayer may be copper. A first sublayer may be 15% to 35% of a total coating thickness and a second sublayer may be 65% to 85% of the total coating thickness. The process may further include mounting a die. Mounting a die may include the die is welded with an alloy of gold and tin.

BRIEF DESCRIPTION OF THE DRAWINGS

A further understanding of the nature and advantages of the disclosed technology may be realized by reference to the remaining portions of the specification and the drawings.

FIG. 11 illustrates a perspective view of a conductive alloy preform for adhering the flange to the insulator according to embodiments herein.

FIG. 12 illustrates a perspective view of a conductive alloy preform for attaching the insulator to leads according to embodiments herein.

FIG. 13 illustrates a perspective view of a lead frame including a plurality of leads according to embodiments herein.

FIG. 14 illustrates a perspective view of a non-conductive adhesive for adhering the insulator to a cover according to embodiments herein.

FIG. 15 illustrates a perspective view of a cover for the microelectronics package assembly according to embodiments herein.

DETAILED DESCRIPTION

Introduction

Figure 1:
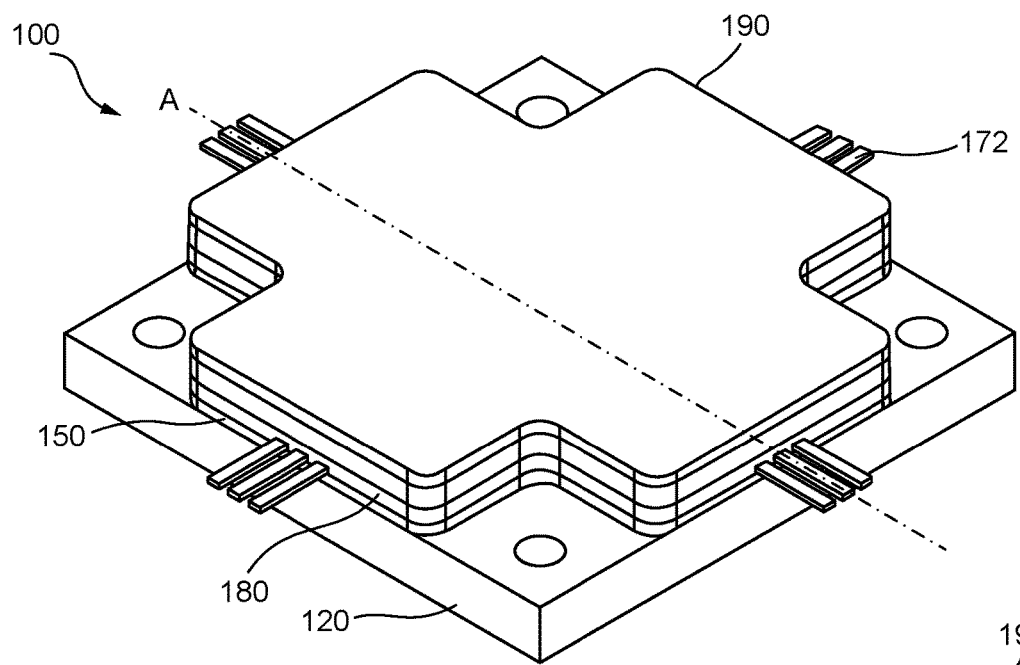
FIG. 1 illustrates a perspective view of a microelectronics package assembly according to embodiments herein.

According to the various embodiments described herein microelectronics package assemblies are produced to meet the demands for radio frequency (RF) performance, adhesion (high sheer strength), and yield (no cracking due to thermal properties mismatch), for telecommunication applications among others. 5G wireless amplifiers operate at frequencies >3 GHz. For high power base stations located in rural areas, GaN RF power transistors need to deliver>5 W at frequencies between 2 and 10 GHz. RF performance using package assemblies as described satisfies these needs with low loss at frequencies up to 10 GHz. This processes herein provide significant improvements to reduce production time and reduce outgassing that has deleterious effects to RF performance. By improving outgassing performance the assemblies described herein also have fewer voids and improved adhesion, which expands the performance range at extreme temperatures such as up to 200° C.

The inventors have now found that by employing thin films to coat the flange to replace repeated plating baths and sintering cycles improves reliability and allows for employing higher dissipation materials for the flange. Further, thin films are also employed to replace repeated plating baths and sintering cycles to coat the insulator thereby removing organic content in the insulator and at the interfaces of the insulator and other components. The thin film coatings also enable the insulator to be selectively metallized for more precise control, to allow for narrower widths of leads, and to minimize the spacing distance between leads, also leading to greater RF performance. The inventors have also found that greater RF performance can been realized employing laser removal (of metallization) to provide thin RF lines. Lead bonding is further enhanced using soft solder as is die attachment with gold-tin alloys. Package assemblies can also have attachment enhanced using braze penetrating the through holes to provide additional or alternative means of bonding. The package assemblies as disclosed herein also are compatible with thermoplastic covers, specifically liquid crystal polymer covers for gross leak safe packaging. The package assemblies as disclosed herein also are compatible with KOVAR® ring frames and etch lids to provide ceramic covers for hermetically sealed fine leak safe packaging. KOVAR® is iron-nickel-cobalt alloy.

Terms

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/components/steps and permit the presence of other ingredients/components/steps. However, such description should be construed as also describing compositions, articles, or processes as "consisting of" and "consisting essentially of" the enumerated ingredients/components/steps, which allows the presence of only the named ingredients/components/steps, along with any impurities that might result therefrom, and excludes other ingredients/components/steps.

Numerical values in the specification and claims of this application should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "2.3 ppm/K to 17.5 ppm/K" is inclusive of the endpoints, 2.3 ppm/K or 17.5 ppm/K, and all the intermediate values).

The process steps described herein refer to temperatures, and, unless provided for, this refers to the temperature attained by the material that is referenced, rather than the temperature at which the heat source (e.g. furnace, oven) is set. The term "room temperature" refers to a range of from 20° C. to 25° C. (68° F. to 77° F.).

Microelectronics Package Assembly

Figure 2:
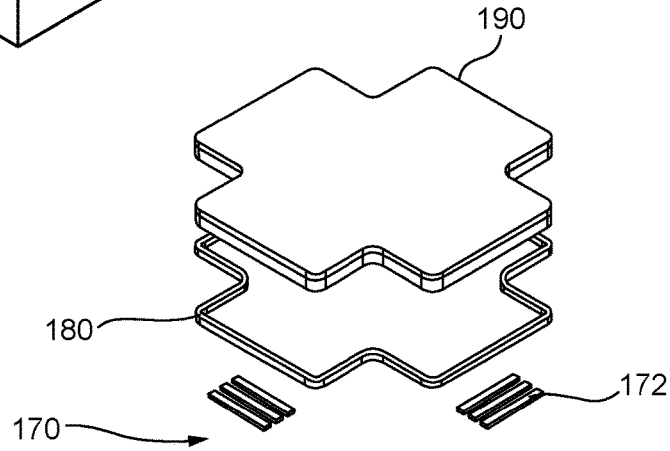
FIG. 2 illustrates an exploded view of the microelectronics package assembly of FIG. 1.
Figure 2:
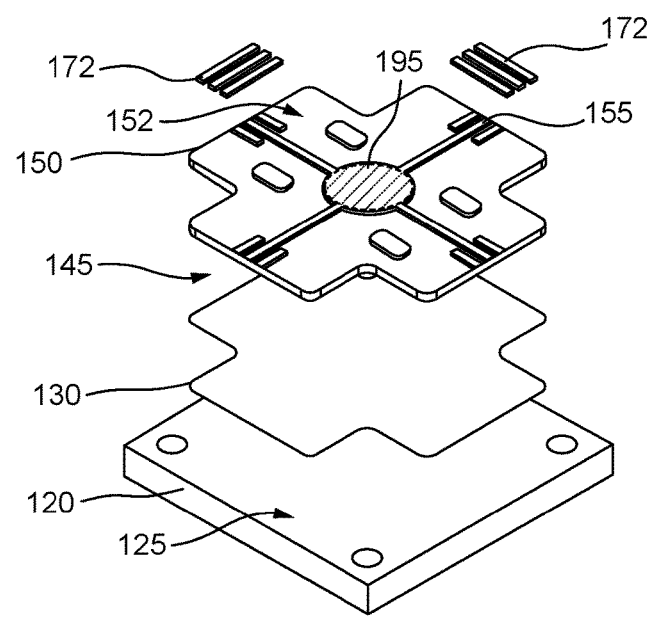

The disclosure relates to microelectronics package assemblies and processes for making the same that have the aforementioned advantages. One example of the microelectronics package assembly is illustrated in FIGS. 1 and 2. The package assembly 100 comprises a flange 120, an insulator 150, and a conductive alloy preform 130 disposed between flange 120 and insulator 150. Insulator 150 further includes an upper surface 152 that is at least partially coated with coating 155. Depending on the application, insulator 150 may partially enclose a semiconductor die and/or may be used for mounting a die. It should be understood that multiple dies may employed without affecting the scope of the present invention. FIG. 2 shows die 195 positioned centrally on a portion of the insulator upper surface 152 that is coated with coating 155. Other configurations for enclosing and/or mounting a die are contemplated, including positioning die 195 alternatively onto the flange. Further, package assembly 100 comprises conductive alloy preform 130 (shown in FIG. 11) and, as shown in FIGS. 1-2, a lead frame 170 having a plurality of leads 172, a non-conductive adhesive 180, and a cover 190.

Figure 3:
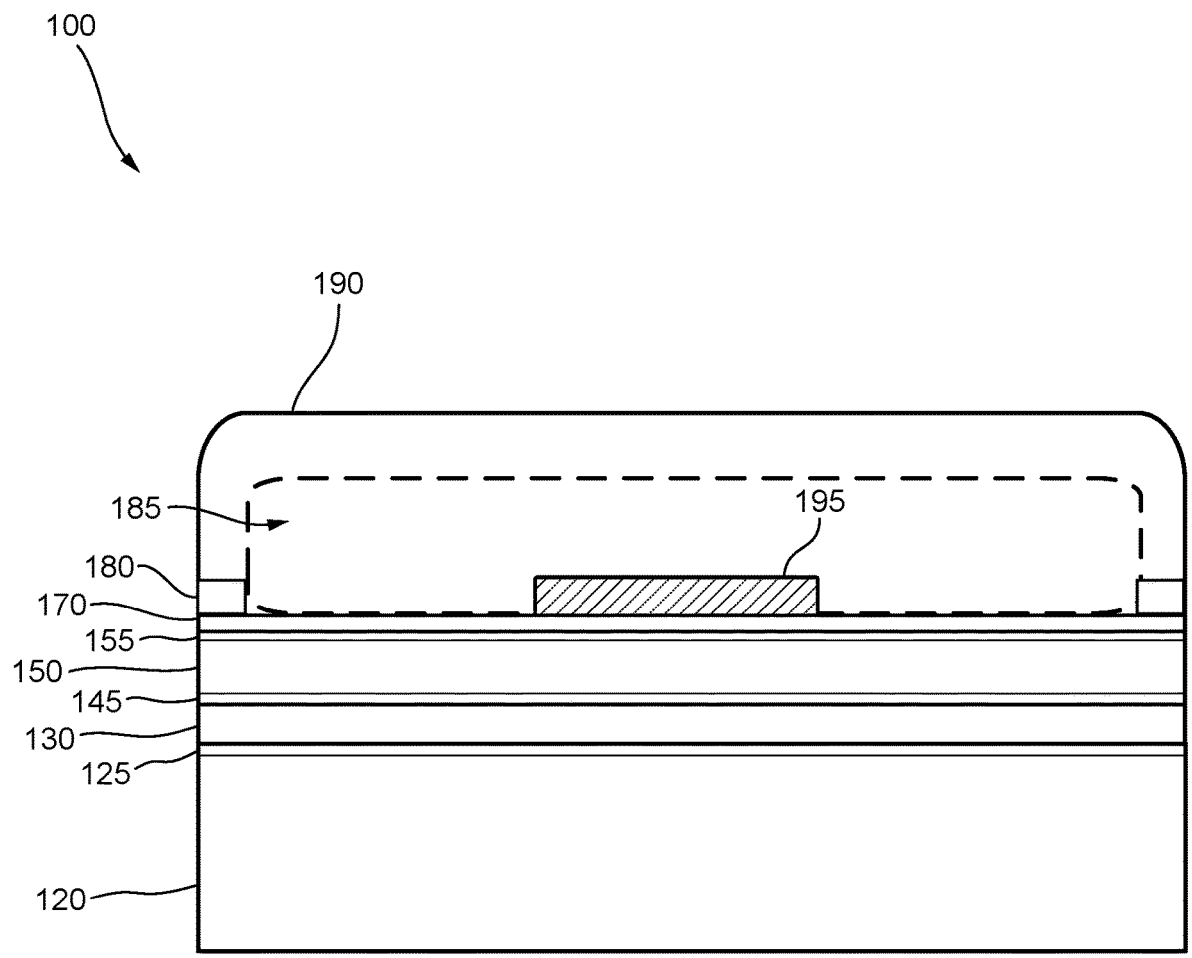
FIG. 3 illustrates a cross-sectional view of the microelectronics package assembly taken along line "A" of FIG. 1.

FIG. 3 shows a cross-sectional view of package assembly 100 as viewed along line "A" of FIG. 1. Flange 120 includes coating 125. Coating 125 on the upper surface of the flange is also referred to herein as the first coating. Conductive alloy preform 130 is in contact with coating 125. Insulator 150 includes coating 145 and coating 155. Coating 145 on the bottom surface of the insulator is referred to herein as the second coating. Coating 155 on the upper surface of the insulator is referred to herein as the third coating. In some instances, coatings 125 and 145 on opposing surfaces of a flange and an insulator, respectively, may be referred to as a first coating, and in that instance, coating 155 on the upper surface of the insulator is referred to as the second coating. In addition to conductive alloy preform 130 being in contact with coating 125, conductive alloy preform 130 is also in contact with coating 145. Coating 155 is selectively applied to partially coat upper surface of insulator 150 only where leads, interconnects, and/or a die will be attached. Alternatively, coating 155 may be applied over the entirety of the insulator upper surface and then selectively removed via laser where leads, interconnects, and/or a die are to be positioned. Leads and/or interconnects 172 are in contact with coating 155. Non-conductive adhesive 180 is in contact with leads 172, as shown and is in contact with insulator 150 in portions away from line "A" where there is an absence of coating 155 due to coating 155 being selectively applied. Cover 190 is in contact with non-conductive adhesive 180 and also defines a cavity 185 within which die 195 resides. Die 195 may be attached to the package assembly 100.

Figure 4:
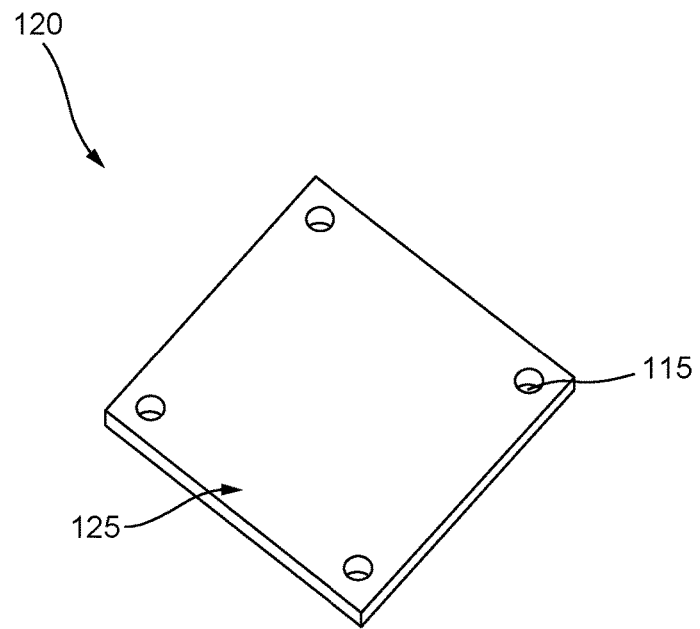
FIG. 4 illustrates a perspective view of the upper surface of a flange of the microelectronics package assembly of FIG. 1.
Figure 5:
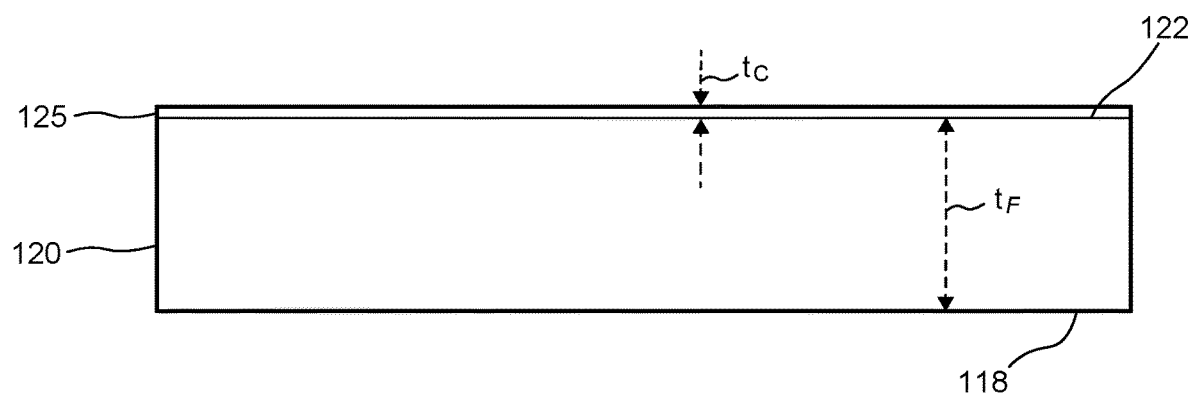
FIG. 5 illustrates a cross-sectional view of the flange of the microelectronics package assembly of FIG. 1.

Flange 120, as shown in perspective view of FIG. 4, may have through holes 115 for attaching the packaging to the microelectronics application. It should be understood that the holes 115 are not particular limiting, and that slots or grooves may be formed in the flange. The holes, slots, or grooves may be used for mounting the flange to a substrate or heat sink base. In one embodiment, the holes, slots, or grooves are formed by etching, milling, grinding, stamping, or other suitable methods. A coating 125, preferably a thin coating, $t_C$, is disposed on the upper surface 122 of flange 120, as seen in FIG. 5, which is a cross-sectional view of flange 120 of FIG. 4. Another coating (not shown) may be applied to the bottom surface of flange 120, opposite surface 122. A thickness, $t_F$, of the flange is defined between upper surface 122 and bottom surface 118.

Figure 6:
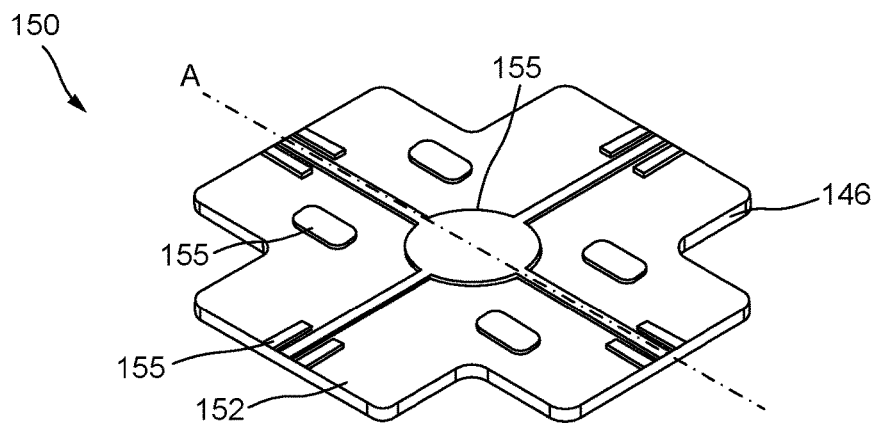
FIG. 6 illustrates a perspective view of an insulator of the microelectronics package assembly of FIG. 1.
Figure 7:
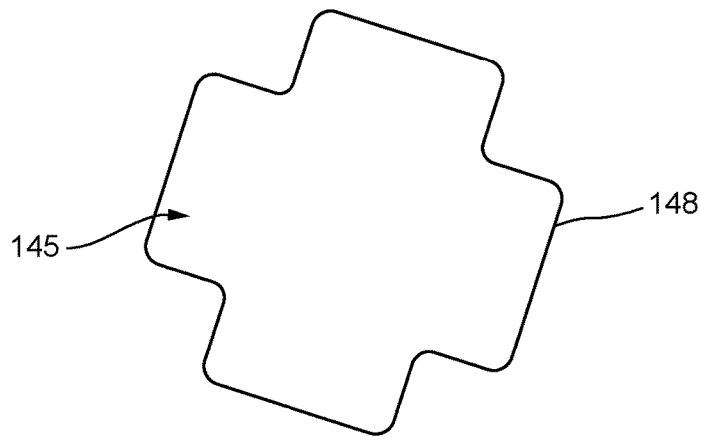
FIG. 7 illustrates a bottom surface view of the insulator of the microelectronics package assembly of FIG. 1.
Figure 8:
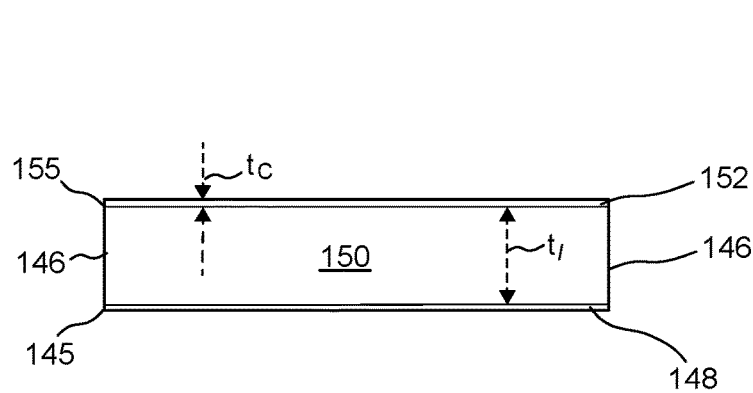
FIG. 8 illustrates a cross-sectional view of the insulator of the microelectronics package assembly of FIG. 1.

Insulator 150 is shown in FIGS. 6-8. FIG. 8 shows the cross-section taken along line "A" of FIG. 6. In one embodiment, a coating 145, preferably a thin coating, $t_C$, is disposed onto the entire bottom surface 148 of insulator 150, as shown in FIGS. 7 and 8. There is no coating applied to a plurality of faces 146 connecting bottom surface 148 to upper surface 152 of insulator 150. The insulator 150 is partially metallized. In one embodiment, coating 155 is selectively applied to a portion of upper surface 152 of insulator 150. The portion having coating 155 is for subsequent attachment of leads, interconnects, and/or a die.

A thickness, $t_I$, of the insulator is defined between upper surface 152 and bottom surface 148. In some embodiments, the insulator may include a plurality of through holes 154 through the thickness as shown in a partial top view of insulator 250 as in FIG. 9. The through holes (also called vias) may be configured in a pattern along a peripheral area 255 of the insulator 250. Depending on the application and die, the through holes 154 may be drilled into the insulator to enhance RF signals. The through holes 154 may have diameters ranging from 0.01 mm to 0.7 mm, e.g., from 0.10 mm to 0.7 mm, from 0.10 mm to 0.25 mm, or 0.15 mm to 0.2 mm. In preferred embodiments, the through holes are 0.15 mm±10% in diameter. The coating as applied to either surface of the insulator does not adversely affect the performance of the holes.

Figure 9:
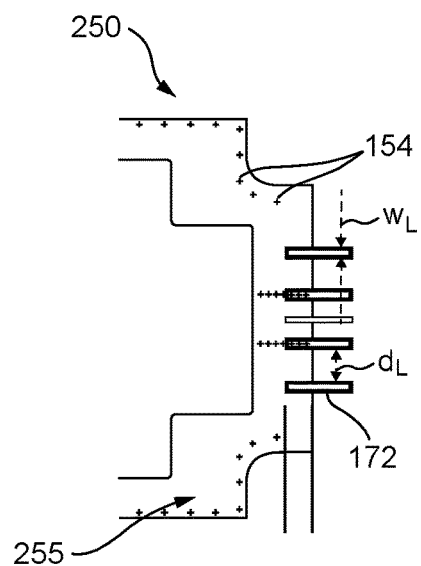
FIG. 9 illustrates a partial top view of another embodiment of the insulator demonstrating through holes through the thickness of the insulator according to embodiments herein.
Figure 10:
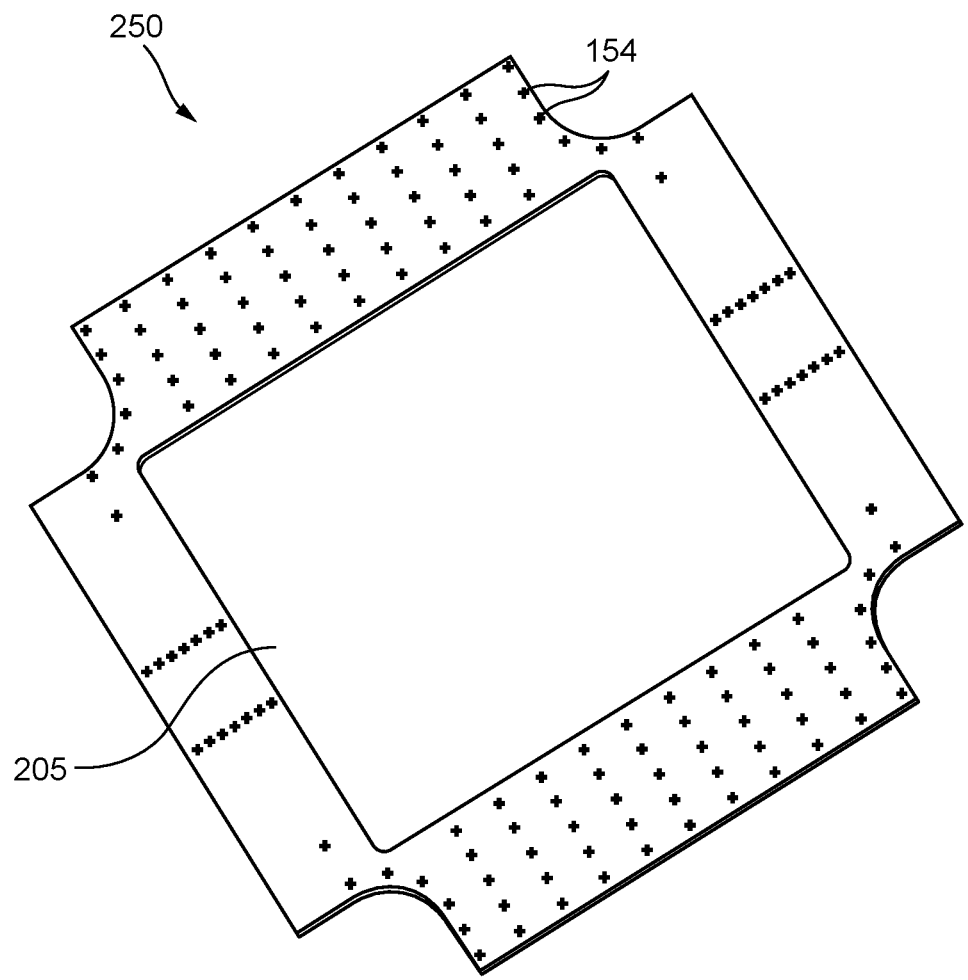
FIG. 10 illustrates a perspective view of the insulator as in FIG. 9 including through holes according to embodiments herein.

FIG. 10 illustrates a perspective view of ceramic insulator 250 as shown partially in FIG. 9. Insulator 250 has opening 205. Opening 205 is void space in the middle, and as such, the insulator may also be referred to as a ceramic ring. Insulator 250 includes a plurality of through holes 154 through the thickness of the insulator. The through holes may also be referred to as vias. In FIG. 10, vias 154 are represented by cross-hairs due to small size however they are circular through holes having a diameter. In the embodiment of FIG. 10 as shown, the diameter of through holes 154 are 0.15 mm. Insulator 250 may, for example, be $Al_2O_3$ and can include from 50 to 300 vias depending on the design of the constructions to allow RF waves to travel. For the example as shown, there are 146 through holes and the insulator 250 has an opening 205 or void at the middle that measures 11.7 mm×13.5 mm. The through holes, or vias, may be utilized to enhance bonding. In subsequent brazing, the braze metal penetrates the through holes to provide greater bonding of the insulator with the preform and/or flange to which the insulator 250 interfaces.

Figure 23:
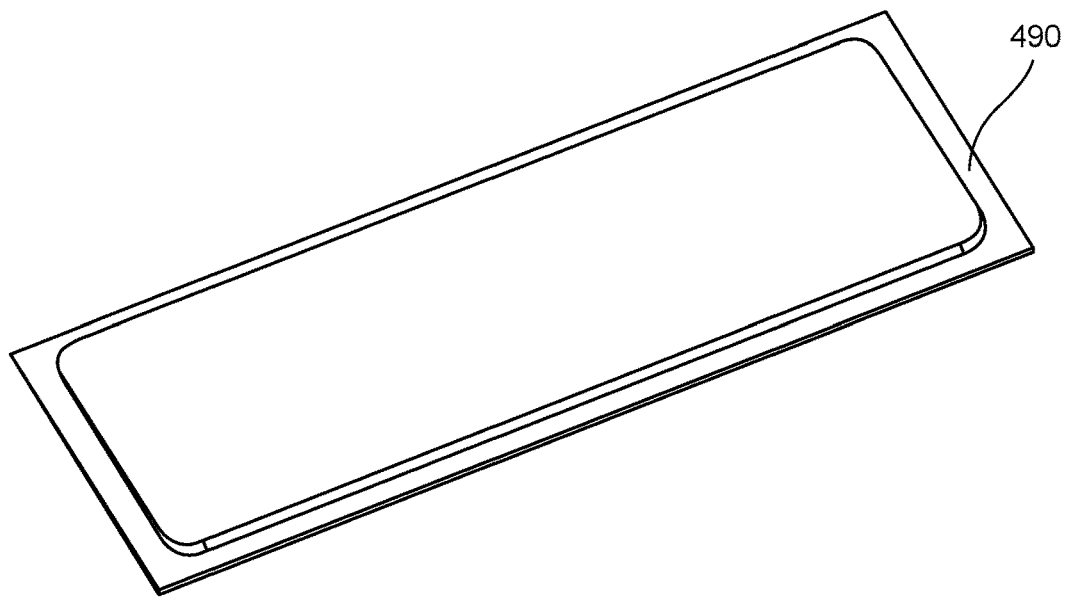
FIG. 23 illustrates a bottom perspective view of a etch lid as shown covering the microelectronics package assembly as in FIG. 22 according to embodiments herein.

Additional components of package assembly 100 are shown individually in FIGS. 11-15. FIG. 11 illustrates a perspective view of conductive alloy preform 130 for adhering the flange to the insulator. Preform 130 may be Ni plated to enhance bonding to the flange and/or the insulator. Lead frame 130 is also referred to as the first conductive alloy preform herein. FIG. 12 illustrates a perspective view of another conductive alloy preform 160 for attaching the insulator to leads. Preform 160 is also referred to as the second conductive alloy preform herein. FIG. 13 illustrates a perspective view of a lead frame 170 including a plurality of leads 172. FIG. 14 illustrates a perspective view of non-conductive adhesive 180 for adhering the insulator to a cover. FIG. 15 illustrates a perspective view of cover 190 to cover, protect, and seal the microelectronics package assembly. The cover may be LCP as shown. Alternatively, a ceramic cover may be used (as shown in FIG. 23).

Figure 16:
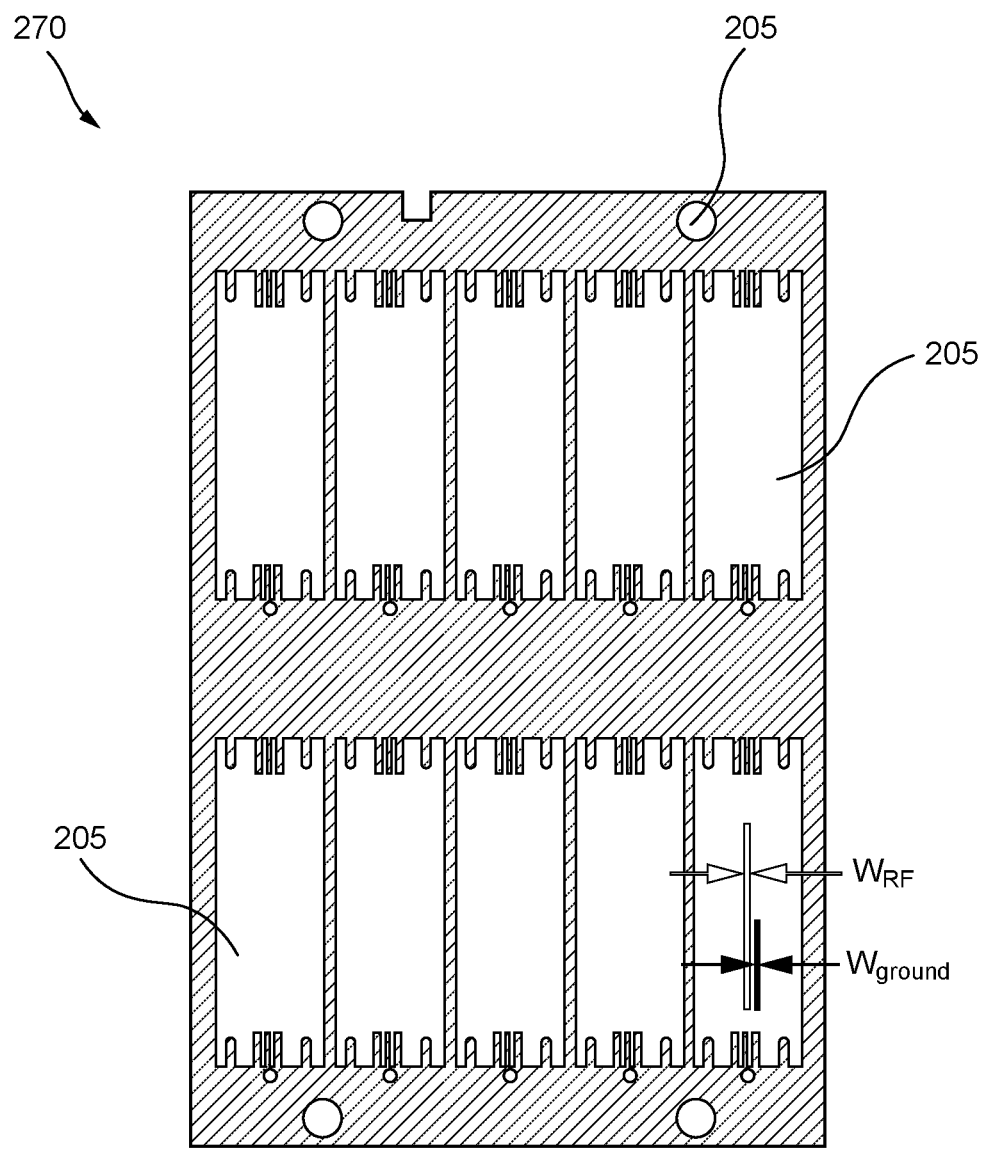
FIG. 16 illustrates a top view of a lead frame according to embodiments herein.

FIG. 16 illustrates a top view of another lead frame 270 according to embodiments herein. The lead frame may be cut from alloy sheets of about 2 mil thickness, for example, from a nickel-iron alloy sheet. The sheet is etched away to create the void areas 205. The design allows for RF lines and grounds spaced apart for optimal performance. In the example shown in FIG. 16, RF line has a width, $w_{RF}$, of 0.012" (0.31 mm) and grounds have width, $w_{ground}$, of 0.020" (0.51 mm).

Other package assembly configurations are contemplated and the examples herein should not be considered limiting. For example, another configuration for a microelectronics package assembly is shown in FIGS. 17-23.

Figure 17:
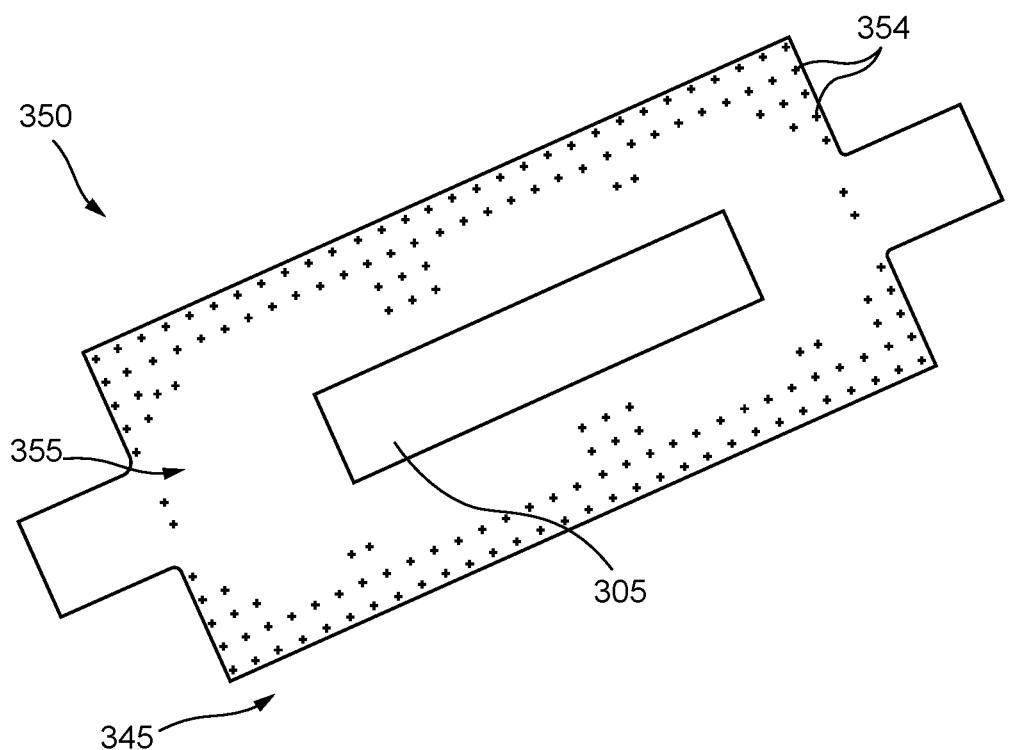
FIG. 17 illustrates a perspective view of another insulator including through holes according to embodiments herein.

FIG. 17 illustrates a perspective view of another ceramic insulator 350. Insulator 350 includes coating 345 on insulator bottom surface and coating 355 on insulator upper surface (similarly as described previously for insulator coatings 145 and 155). The insulator includes through holes or vias 354. The insulator may have an opening 305 (to accommodate die subsequent die placement). In alternative embodiments, the insulator may have one or more openings to accommodate shims and/or risers for providing a pedestal above the plane of the upper surface of the insulator. The shims and/or risers may be CuW or other suitable materials such as Cu—CuMo—Cu, Cu—Mo—Cu, Cu, or combinations thereof. A die may be positioned within the opening or atop the pedestal.

The through holes 354 may be penetrated with braze as previously described to enhance bonding to components (e.g., flange and/or preform) interfacing with the insulator bottom surface.

Figure 18:
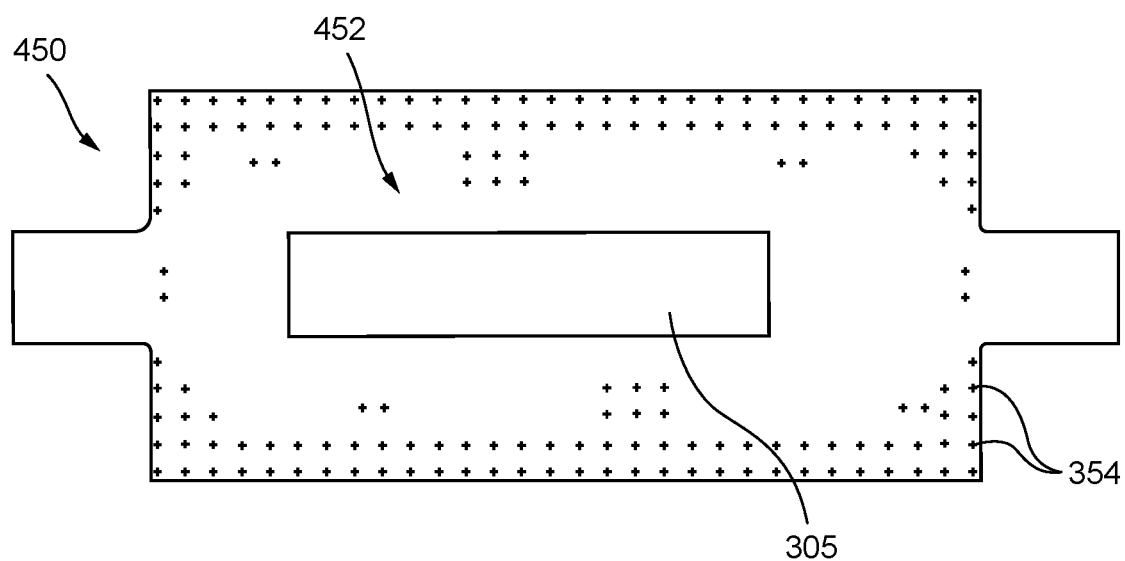
FIG. 18 illustrates a top view of the insulator of FIG. 17 according to embodiments herein.

FIG. 18 illustrates a top view of the insulator of FIG. 17 where the upper surface of the insulator has been deposited with coatings 345 and 355 (such as described previously for coatings 145 and 155). Such coatings may include one or more deposited layers of titanium and/or copper, and further may include deposited layers of gold and/or nickel. The top layer 452 of metallization is gold so that the upper surface of insulator 450 is entirely coated with gold prior to laser removal of metallized layers for circuit formation.

Figure 19:
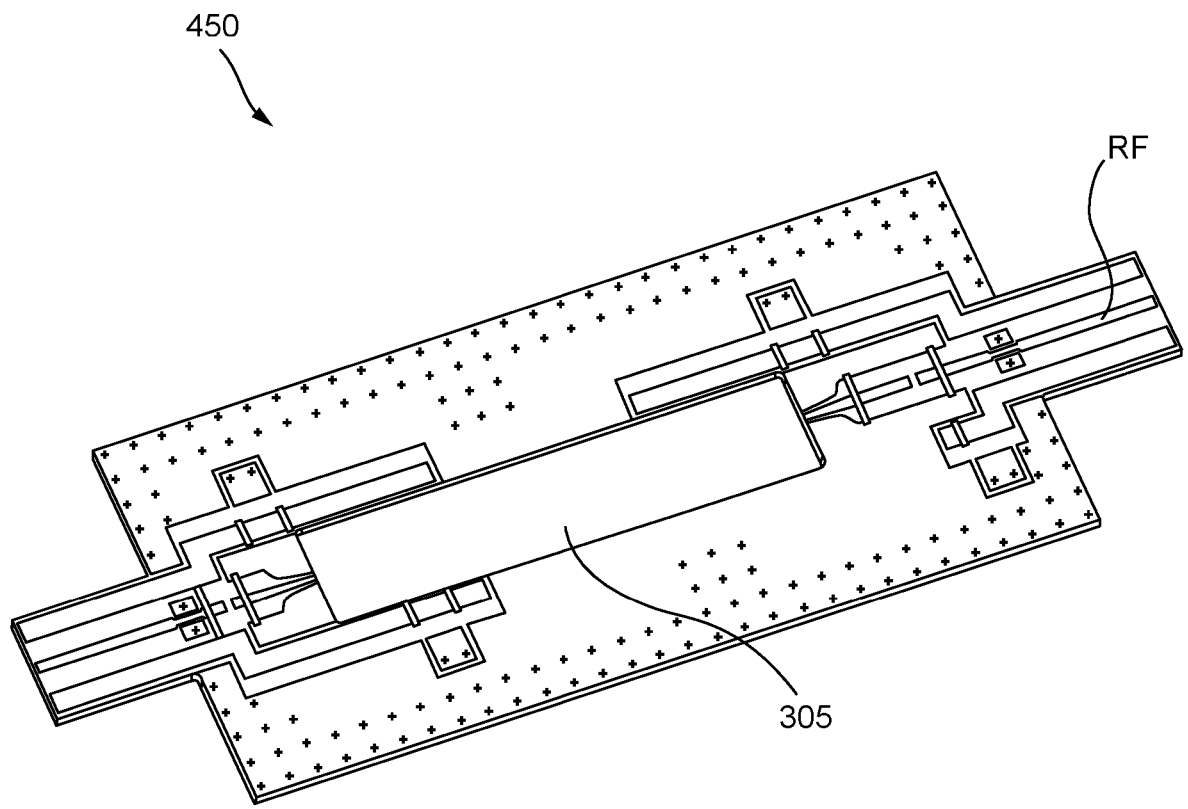
FIG. 19 illustrates a perspective view of the insulator of FIG. 17 having been further metallized, and with the metallization at least partially removed to form circuitry, according to embodiments herein.

FIG. 19 illustrates a perspective view of the insulator of FIGS. 17 & 18 after further processing. The metallization as in FIG. 18 including gold is at least partially removed to form circuitry including RF lead as shown in FIG. 19. The RF ceramic lead is dimensionally very fine (narrow $w_{RF}$) and is thus suitable for high temperature thermal applications. In this example, the insulator, which may be $Al_2O_3$, is metallized after the via holes are formed by lasers. As such both upper and lower surfaces of the insulator are metallized as are the inner walls of the vias (through holes) to allow braze material to penetrate and thus enhance bonding with other components.

Figure 20:
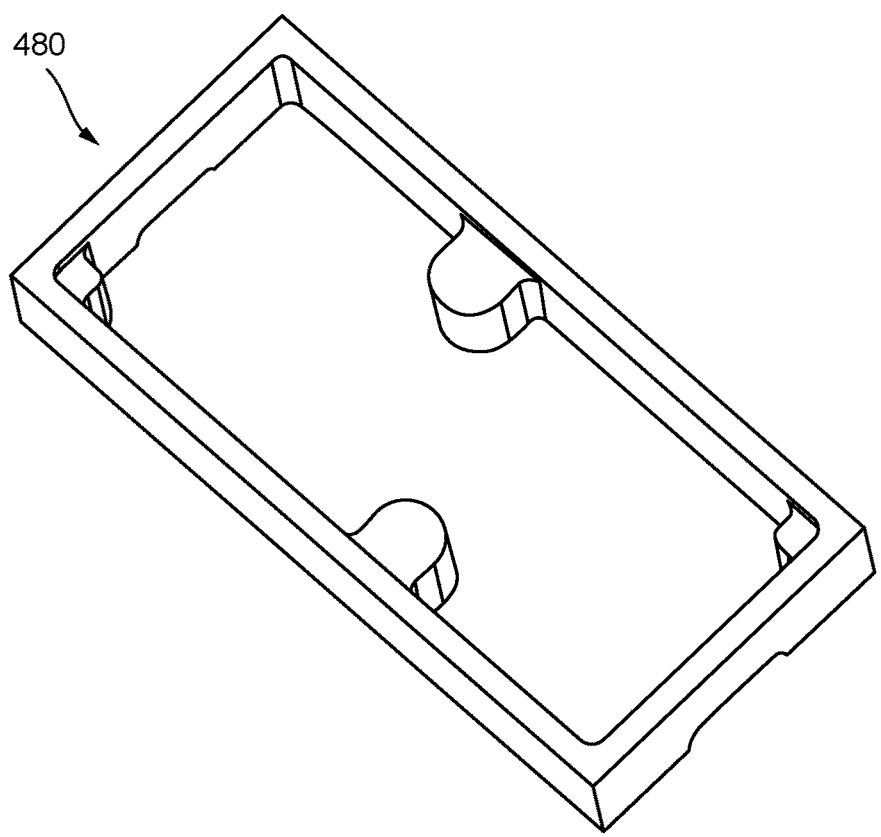
FIG. 20 illustrates a top perspective view of a KOVAR® ring frame according to embodiments herein.
Figure 21:
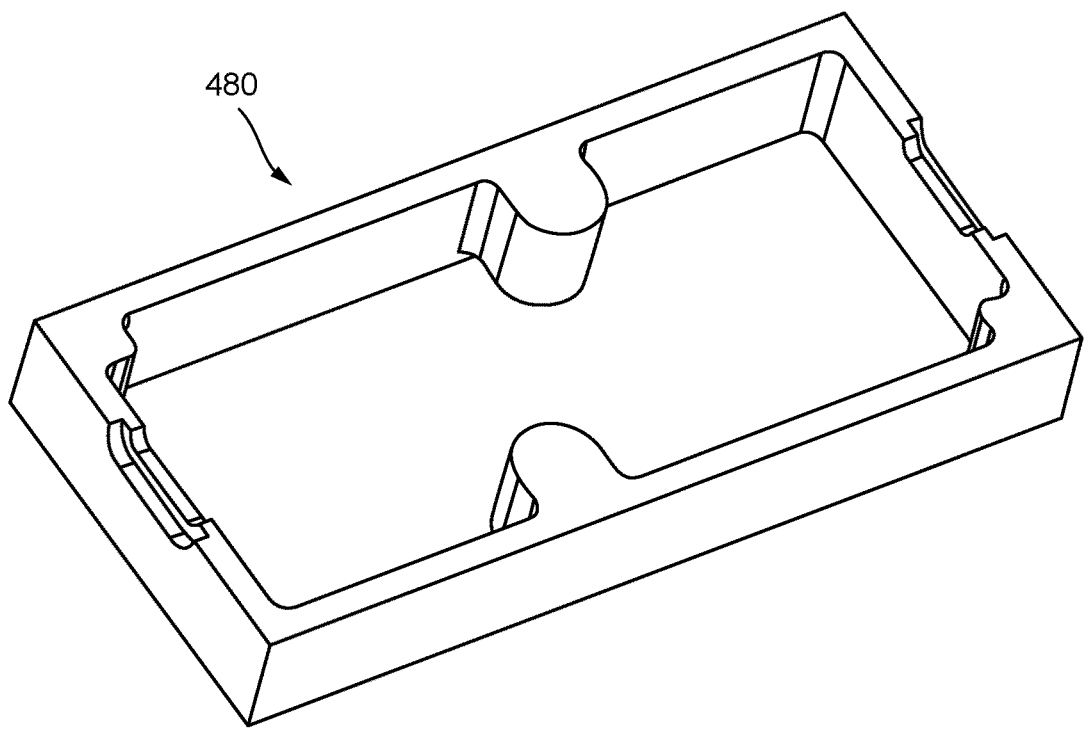
FIG. 21 illustrates a bottom perspective view of the KOVAR® ring frame of FIG. 20 according to embodiments herein.
Figure 22:
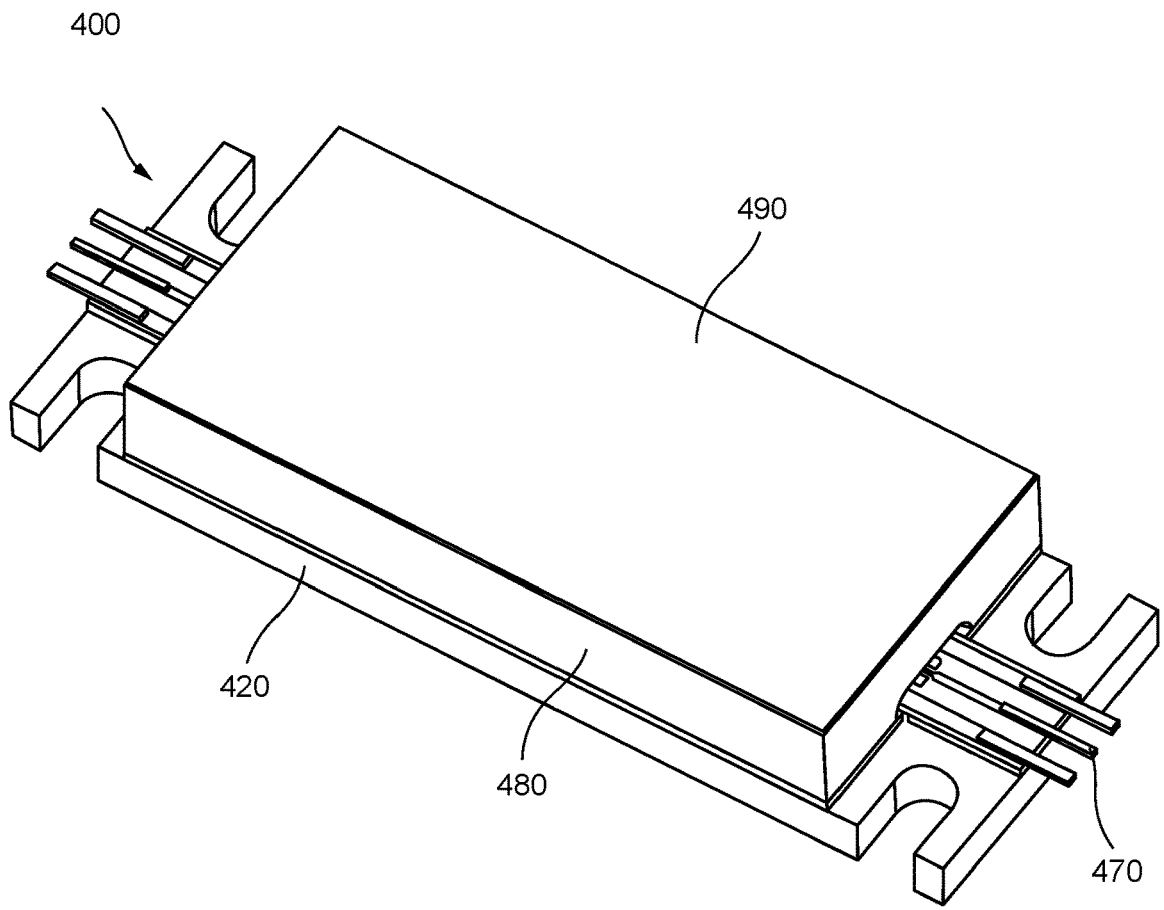
FIG. 22 illustrates a perspective view of the microelectronics package assembly according to embodiments herein.

To provide a fine leak safe hermetically sealed package assembly, a KOVAR® ring frame 480 as illustrated in FIG. 20 (top view) can be employed with the package assemblies according to embodiments herein. FIG. 21 illustrates a bottom perspective view of the KOVAR® ring frame 480 of FIG. 20. Ring frame 480 may be sealed using Au—Sn seam seals around the sides and/or to seal with the lid 490. FIG. 22 illustrates a perspective view of the microelectronics package assembly 400 having flange 420, insulator 450, ring 480, and lid 490 as described herein. Etch lid 490, bottom perspective view as illustrated in FIG. 23, can be used with the microelectronics package assembly 400 as in FIG. 22. KOVAR® ring frame 480 and etch lid 490 are Ni/Au plated. In some instances, multiple layers are formed such as Ni/Au/Ni/Au in order to reduce effects of oxidation. In other instances, palladium plating is used in conjunction with or instead of Ni/Au plating. The package assembly may be provided to a customer without a die, so that placement of the die within the insulator opening 305 (as in FIG. 19) is performed separately.

Materials

Important properties for consideration in materials selection of components of the packaging assembly include, among others, thermal conductivity, coefficient of thermal expansion (CTE), heat dissipation, and dielectric properties, as well as mechanical properties, for example. A match of CTE between components is especially important for mechanical integrity, e.g., to minimize or eliminate potential for cracking of the flange and/or ceramic.

The flange is a heat spreading material that efficiently dissipates heat. The flange is constructed to maintain the temperature of the die below a maximum operating temperature, which for some RF applications may be less than or equal to 200° C. Suitable thermal dissipating materials for the flange may be non-magnetic or non-ferrous. Flange 120 is a high thermal conductive material having a thermal conductivity ranging from 140 to 2000 W/(mK), e.g., from 140 to 600 W/(mK) or from 175 to 550 W/(mK), at room temperature and a coefficient of thermal expansion (CTE) ranging from 2.3 ppm/K to 17.5 ppm/K, e.g., from 2.3 ppm/K to 14.4 ppm/K or from 4.6 ppm/K to 14.4 ppm/K. In a preferred embodiment, the flange material may have a thermal conductivity ranging from 140 to 650 W/(mK) at room temperature and a CTE ranging from 5.5 ppm/K to 17.5 ppm/K. Examples of suitable flange materials include a diamond based composite, Cu—CuMo—Cu (CPC), copper tungsten (CuW), Cu—Mo—Cu (CMC), Cu, or combinations thereof.

In certain aspects, the flange is a high thermal conductive material having a thermal conductivity ranging from 140 to 400 W/(mK) at room temperature and a CTE ranging from 5.5 ppm/K to 17.5 ppm/K. Suitable example flange materials include Cu—CuMo—Cu (CPC), copper tungsten (CuW), Cu—Mo—Cu (CMC), Cu, or combinations thereof. These examples may include laminates as flange material.

In other aspects, the flange high thermal conductive material has a thermal conductivity ranging from 500 to 600 W/(mK) at room temperature and a CTE ranging from 6.0 ppm/K to 10.5 ppm/K. Suitable example flange materials include a copper diamond composite, such as DC60 or DC 70, or a silver diamond composite, such as AD90. Diamond composites are available such as from A.L.M.T. Corp. or Sumitomo Electric Group. In one embodiment, it is desirable that the flange is made of a material having a CTE that is substantially similar to the insulator material.

Flange thickness, as defined between flange upper surface 122 and flange base surface 118, is thickness, $t_F$. Flange thickness, $t_F$, ranges between 0.5 mm to 5.0 mm, e.g., from 1.0 mm to 3.0 mm, or from 1.5 mm to 2.5 mm.

Specifically, the present inventors have found that thin film coatings as are described below are more suitable for diamond composite flange materials. The processes described herein are compatible with diamond composites, in particular, and overcome the disadvantages with the repeated plating baths and sintering cycles. Thus, in one embodiment, the thin films of coatings 125, 145, and/or 155 are useful in providing numerous advantages to the package assemblies disclosed herein.

The coatings, referring back to FIG. 3, include coatings 125, 145, and 155 (first coating 125 on upper surface of flange 120, second coating 145 on bottom surface of insulator 150, and third coating 155 on upper surface of insulator 150) may each include a thin film of titanium, copper, or combinations thereof. Preferably, the thin coating is apply in a manner that results in a controlled and substantially uniform thickness. The thickness of the coatings, $t_C$, for coatings 125, 145, and 155 may be less than or equal to 1 micron. For example, the thickness, $t_C$, may be from 0.1 µm to 1.0 µm, e.g., from 0.4 µm to 1.0 µm, from 0.5 µm to 1.0 µm, from 0.6 µm to 1.0 µmm, or from 0.7 µm to 0.9 µm. In terms of lower limits, the thickness, $t_C$, may be greater than 0.1 μmm, e.g., greater than 0.2 μm, greater than 0.3 μm, greater than 0.4 μm, greater than 0.5 μm, greater than 0.6 μm, greater than 0.7 μm, or greater than 0.8 μm. A sufficient amount of material for the thin film coating is needed for adhering with the conductive alloy preform, and when the thickness is too low the adhesion strength may be reduced. In terms of upper limits, the thickness, $t_C$, may be less than 1.0 μm, e.g., less than 0.9 μm, less than 0.8 μm, less than 0.7 μm, or less than 0.6 μm. The processes described herein provide a sufficient amount of material in the thin coating, and having too thick of a coating can lead to reduced production times and inefficient processes. Thus in preferred embodiments, the thickness, $t_C$, is in the amount from 0.5 μmm to 1.0 μm. In one embodiment, the thickness, $t_C$, is about 0.8 μm±10%. Insulator coatings 345 and 355, as shown in FIG. 17 for insulator 350 (see also embodiment illustrated in FIG. 22), as well as flange coating 325 (not shown) also have thickness, $t_C$, as described above.

In some embodiments, any of the coatings 125, 145, and 155 (also 325, 345, and 355) described herein may each include two or more sublayers, where the total thickness of the sublayers is also less than or equal to 1 micron, e.g., total thickness of the sublayers is equal to the thickness, $t_C$. For example, a first sublayer of titanium is applied having a thickness of from 0.05 μm to 0.35 μm, or any increment of 0.05 μm there between, and a second sublayer of copper is applied atop the first sublayer. The copper sublayer has a thickness of from 0.45 μm to 0.75 μm, or any increment of 0.05 μm there between. The total thickness of the first sublayer and the second sublayer is less than or equal to 1 micron. In preferred embodiments, the titanium first sublayer is from 0.12 μm to 0.28 μm and the copper second sublayer is from 0.52 μm to 0.68 μmm. In one embodiment, the titanium first sublayer is about 0.2 μm±10% and the copper second sublayer is about 0.6 μm±10%. Any or all of coatings 125, 145, and 155 (also 325, 345, and 355) may be applied via physical vapor deposition (PVD), atomic deposition, chemical deposition, or other suitable sputtering techniques. In certain aspects, the first, second, and third coatings (e.g., 125, 145, 155 or 325, 345, 355 respectively) for the flange and insulator are deposited by PVD. In one embodiment, coatings 125, 145, and 155 are devoid of nickel. In another embodiment, coatings 325, 345, and 355 are devoid of nickel.

Optionally, coatings 125, 145, and 155 may further include nickel plating thereon. The thickness of the nickel plating over coatings 125, 145, and 155 may be from 1.0 micron to 5.0 microns, e.g., from 1.0 μm to 4.0 μm, from 1.0 μm to 3.5 μm, or from 1.5 μm to 3.0 μm. In terms of lower limits, the nickel plating thickness may be greater than 1.0 μm, e.g., greater than 1.5 μm. In terms of upper limits, the nickel plating thickness may be less than 5.0 μm, e.g., less than 4.5 μm, less than 4.0 μm, or less than 3.5 μm. In preferred embodiments, the nickel plating thickness is included in the amount from about 1.5 μm to about 3.0 μm.

Conductive alloy preform 130 for adhering the insulator 150 to the flange 120 contacts coatings 125 and 145. In one embodiment, preform 130 is nickel plated. The Ni plating on the preform enhances the leads bonding strength by reducing oxidation. The thickness of the nickel plating on the conductive alloy preform 130 is as described above. Conductive alloy preform 160 for adhering the lead frame 170 including a plurality of leads 172 to the insulator 150 contacts coating 155. At least one of conductive alloy preforms 130 and 160 is a solder alloy. In some embodiments, at least one of conductive alloy preforms 130 and 160 is a silver copper (Ag—Cu) alloy or a gold tin (Au—Sn) alloy. In some embodiments, preform 130 is an iron/nickel alloy such as Alloy 42 and lead frame 170 is an silver/copper alloy such as Ag72Cu28.

In some embodiments, at least one of the first and second conductive alloy preforms (130, 160) is an alloy having a chemical composition from 50 to 90% silver and 10 to 50% copper, e.g., from 60 to 80% silver and 20 to 40% copper or from 70 to 80% silver and 20 to 30% copper. The first and second conductive alloy preforms (130, 160) may have a thickness ranging from 0.01 to 0.10 millimeters, e.g., from 0.1 to 5 mm. The thickness of the conductive alloy preforms may be from 0.01 mm to 0.10 mm, e.g., from 0.01 mm to 0.08 mm, from 0.01 mm to 0.05 mm, from 0.01 mm to 0.04 mm, or from 0.015 mm to 0.035 mm. In terms of lower limits, the thickness of the conductive alloy preforms may be greater than 0.01 mm, e.g., greater than 0.015 mm, or greater than 0.02 mm. In terms of upper limits, the thickness of the conductive alloy preforms may be less than 0.10 mm, e.g., less than 0.08 mm, less than 0.06 mm, or less than 0.04 mm. In preferred embodiments, the thickness of the conductive alloy preforms is included in the amount from about 0.025 mm±10%.

The insulator provides a dielectric material that is non-conductive. In certain aspects, the insulator material has a thermal conductivity ranging from 1 to 200 W/(mK) at room temperature and a CTE ranging from 4.5 ppm/K to 11.5 ppm/K. Suitable example insulator materials include sapphire, alumina ($Al_2O_3$), beryllia (BeO), aluminum nitride (AlN), zirconia toughened alumina (ZTA), silicon carbide (SiC), magnesium silicon carbide (Mg—SiC), silicon nitride ($Si_3N_4$), ceramics, or combinations thereof. In some embodiments, the insulator includes sapphire, alumina, aluminum nitride, or combinations thereof. In preferred embodiments, the insulator is alumina having a purity of greater than or equal to 96%.

Insulator thickness, as defined between insulator upper surface 152 and insulator bottom surface 148 is thickness, $t_I$. Insulator thickness, $t_I$, ranges between 0.05 mm to 1 mm, e.g., from 0.1 mm to 0.5 mm.

The insulator, having coating 155 on upper surface 152, may additionally have a plating such as a gold-tin (Au—Sn) alloy thereon. This plating is especially suited for mounting die 195, as shown in FIGS. 2 and 3. The die 195 is not particular limited by the embodiments described herein and in some embodiments the die 195 may be GaN, GaAs, Si, or other suitable semiconductor material. The microelectronics assembly package herein may not include the die itself, which may be positioned subsequently by a consumer.

FIG. 12 illustrates lead frame 170 having a plurality of leads 172. The lead frame may be etched to size. The plurality of leads 172 include an alloy of iron, nickel, or combinations thereof. A suitable alloy is an iron/nickel, such as Alloy 42 and/or Alloy 52. The plurality of leads 172 may include a nickel-iron alloy having from 30 to 80 wt. % nickel, e.g., from 35 to 80 wt. % nickel, with minors amounts of copper, manganese, chromium, aluminum, silicon, and/or molybdenum, of less than 1 wt. %, and the balance being iron. In preferred embodiments, the plurality of leads include an alloy having a chemical composition of from 39 to 43% nickel (Ni), from 0 to 2% manganese (Mn), and balance iron (Fe).

The plurality of leads may have a thermal conductivity ranging from 9.5 W/(mK) to 11.5 W/(mK), e.g., from 9.5 W/(mK) to 11 W/(mK) or from 10 W/(mK) to 10.5 W/(mK).

The plurality of leads may have a CTE ranging from 5.0 ppm/K to 9.0 ppm/K, from 5.5 ppm/K to 9.0 ppm/K or from 6.0 ppm/K to 9.0 ppm/K.

One or more leads 172 may have a width, $w_L$, of less than or equal to 0.35 microns, e.g., less than or equal to 0.30 microns or less than or equal to 0.25 microns. In some embodiments, at least two of the one or more leads has a spacing distance, $d_L$, of less than or equal to 0.35 microns, e.g., less than or equal to 0.30 microns or less than or equal to 0.25 microns. Lead width, $w_L$, and spacing distance, $d_L$, are illustrated in FIG. 9.

Cover 190 as in FIG. 15, or etch lid or cover 490 as in FIGS. 22 and 23, may include alumina ($Al_2O_3$), aluminum nitride (AlN), liquid crystal polymer (LCP), or combinations thereof. LCP covers are thermoplastic, moldable polymers that include glass bead reinforcements for withstanding higher heat while maintaining polymer characteristics. LCP may comprise from 15% to 50% particulates, e.g., glass fibers, glass beads, and/or inorganic filler, from 0 to 2% other additives, and balance aromatic liquid crystal polymer. Other additives may include carbon black, such as less than 2%, e.g. less than 1.5%, or less than 1.0%. LCP covers perform well at operating temperatures of the microelectronics package assembly without microcracks/failures as exhibited in some ceramic covers. In preferred embodiments, the cover is LCP. LCP is available such as Laperos® E471i from Polyplastics Co., Ltd. In one embodiment, LCP includes greater than or equal to 63% aromatic liquid crystal polymer, 35% glass fiber/inorganic filler, less than 1% carbon black, and less than 1% others. In some embodiments, the cover 190 (and/or 490) includes an iron-nickel-cobalt alloy etch configured to provide a hermetic seal that is fine leak safe. A suitable iron-nickel-cobalt alloy etch includes KOVAR®. In other embodiments, the cover includes a non-conductive adhesive, such as epoxy, that is configured to provide a seal that is gross leak safe. Cover 190 has a CTE ranging from 3 ppm/K to 10 ppm/K and a cover thickness ranging from ranging from 0.2 mm to 10 mm, e.g. from 0.5 mm to 5 mm, or from 1 mm to 3 mm.

Processes

In addition to materials selection considerations, other processing considerations are important to providing microelectronics package assemblies with high frequency RF performance and excellent adhesion. Specifically, processes of forming coatings disclosed herein advantageously eliminate organics. As previously described, organics introduced undesirably lead to formation of features such as voids. Such features contribute deleteriously to RF performance, adhesion, and sheer strength.

Specifically the aforementioned coatings 125, 145, and 155 advantageously are applied by deposition, such as physical vapor deposition, atomic deposition, or chemical deposition. Physical vapor deposition (PVD) is a widely used technique for the fabrication of thin films and surface coatings and may refer to a variety of vacuum deposition methods. Sputtering and/or evaporation generate a vapor, in the form of atoms, molecules, or ions, of the coating material supplied from a target. These atoms are then transported to and deposited on the substrate surface, either the flange or insulator, resulting in a thin coating. In one embodiment, PVD is used to form thin film coatings onto the flange and/or the insulator.

Deposition, such as PVD, replaces conventional nickel plating and sintering cycles to provide coatings at the surfaces of the flange and the insulator. Conventional nickel plating and sintering cycles result in outgassing and organics, such as nickel trapping hydrogen during plating, being trapped at the surfaces of the flange and the insulator and then forming voids during subsequent sintering(s). The PVD process is performed in a vacuum and organics are not introduced. The resulting package assembly processed with PVD thin film coatings on the flange and the insulator, therefore, are substantially devoid of organics that result in trapped gases and the formation of voids. Thus, the deleterious trapped organics, which normally would burn off during the conventional sintering cycle resulting in voids, are not present in PVD and the package assemblies disclosed herein are substantially devoid of voids at the surfaces of the flange and the insulator and/or at interfaces between the coatings, e.g., coatings 125, 145, 155, forming interfaces at the respective surfaces of the flange and/or the insulator.

The processes for making microelectronics package assemblies herein include that the coatings applied via PVD are to a thickness of less than or equal to 1 micron, the thicknesses of which, e.g., coatings 125, 145, 155, have been previously described. Coatings, e.g., coatings 125, 145, 155, provide for adhesion resulting in improved sheer strength as compared with coatings provided by conventional plating/sintering repeated cycles in tests from 1,000 g to 5,000 g.

Various processes for making a microelectronics package assembly are disclosed herein.

A process for making a microelectronics package assembly includes depositing a coating onto a flange, where the flange is a high thermal conductive material having a thermal conductivity ranging from 140 to 2000 W/(mK) at room temperature and a coefficient of thermal expansion (CTE) ranging from 2.3 ppm/K to 17.5 ppm/K. The flange may be Cu—CuMo—Cu (CPC), copper tungsten (CuW), Cu—Mo—Cu (CMC), Cu, or combinations thereof. In some embodiments, the flange is CPC.

The flange, such as flange 120 (and similarly for 420) described herein, includes an upper surface 122 as illustrated in FIG. 5. The process includes depositing the coating on the upper surface of the flange so that the coating has a thickness less than or equal to 1 micron. Coating the flange may include one or more sublayers, in other words, a first sublayer, e.g., titanium, and a second sublayer, e.g., copper. Depositing a coating onto the flange may include the deposition techniques as described, such as PVD. In some embodiments, the process includes depositing a coating (i.e., first coating 125 or 325) on the flange upper surface with a first sublayer of titanium, e.g., from 15% to 35% of a total flange (upper surface) coating thickness, and a second sublayer of copper on top of the first sublayer of titanium, e.g., from 65% to 85% of the total flange (upper surface) coating thickness. In one embodiment, depositing a first coating includes depositing two (or more) sublayers: a first sublayer of titanium is from 15% to 35% of a total coating thickness and a second sublayer of copper is from 65% to 85% of the total coating thickness. For example, the coating (e.g., first coating 125 or 325) can include a first sublayer of titanium that is 25%±10% of the flange coating thickness and a second sublayer of copper on top of the first sublayer, where the sublayer of copper is 75%±10% of the flange coating thickness.

The process includes depositing a coating on an insulator surface (e.g., bottom surface 148 of insulator 150 as illustrated in FIG. 8, and similarly for bottom surface of insulator 350) opposing the coated flange upper surface 122. The insulator may include sapphire, alumina ($Al_2O_3$), beryllia (BeO), aluminum nitride (AlN), zirconia toughened alumina (ZTA), silicon carbide (SiC), magnesium silicon carbide (Mg—SiC), silicon nitride (Si$_3$N$_4$), or combinations thereof. In some embodiments, the insulator is Al$_2$O$_3$ or AlN.

The insulator, such as insulator 150 (also 250, 350, or 450) described herein, has a bottom surface. The process includes depositing a coating on the bottom surface 148, in its entirety, of the insulator so that the coating has a thickness less than or equal to 1 micron. Depositing a coating 145 (or 345) onto the insulator bottom surface may include one or more sublayers, in other words (and similarly as for the flange above), a first sublayer, e.g., titanium, and a second sublayer, e.g., copper. Depositing a coating onto the insulator bottom surface may include deposition techniques as described, such as PVD. In some embodiments, the process includes depositing a coating (i.e., second coating 145 or 345) on the insulator bottom surface 148 with a first sublayer of titanium, e.g., from 15% to 35% of a total insulator (bottom surface) coating thickness, and a second sublayer of copper on top of the first sublayer of titanium, e.g., from 65% to 85% of the total insulator (bottom surface) coating thickness. In some embodiments, the process includes coating the insulator bottom surface with a first sublayer of titanium, which may be 25%±10% of the insulator coating thickness, and with a second sublayer of copper on top of the first sublayer, where the sublayer of copper is 75%±10% of the insulator bottom surface coating thickness.

Depositing the coating by deposition techniques as described is especially important to the coating/insulator interface. Previously, techniques such as repeated plating baths and sintering cycles and/or by metallizing with a paste, such as a paste containing molybdenum manganese, introduced organics and binders that produced a leftover residue after heating onto the insulator. The trapped organic content introduced oxide contaminants and/or voids that adversely affected adhesion properties and thus RF performance.

The process also includes depositing a coating (i.e., third coating 155 or 355) on the insulator upper surface 152 with a first sublayer of titanium, e.g., from 15% to 35% of a total insulator (upper surface) coating thickness, and a second sublayer of copper on top of the first sublayer of titanium, e.g., from 65% to 85% of the total insulator (upper surface) coating thickness. In some embodiments, the process includes depositing a coating onto the insulator upper surface with a first sublayer of titanium, which may be 25%±10% of the insulator upper surface coating thickness, and a second sublayer of copper on top of the first sublayer, where the sublayer of copper is 75%±10% of the insulator upper surface coating thickness. In some instances, the insulator 150 is coated (e.g., by depositing techniques described herein) to entirely coat the bottom and upper surfaces of the insulator, and thus the insulator coatings may be referred to as the second coating collectively (rather than second and third coatings).

Optionally, circuitry may be formed onto the insulator directly by laser removal of the coated layers, thus advantageously eliminating the need for printed circuit board(s) (PCB). The process may further include the insulator having a plating such as a gold-tin (Au—Sn) alloy thereon (over the coating 155 or 355). The process can include laser removal to remove the coating and/or gold-tin plating selectively in areas as needed to expose the upper surface of insulator 150 (or 250, 350, or 450).

The process includes positioning a conductive alloy preform, such as conductive alloy preform 130 as described herein, for adhering the insulator to the flange. Positioning includes contacting the conductive alloy preform to the flange coating (on the upper surface of the flange) and to the insulator coating (on the bottom surface of the insulator). Adhering the conductive alloy preform to the flange and the insulator may be performed in a furnace at a temperature of greater than or equal to 850° C., e.g. greater than or equal to 875° C. or greater than or equal to 900° C.

The process may include cutting the conductive alloy preform to size and pattern desired. The preform may have a thickness of from 0.01 to 0.05 mm, e.g., 0.025 mm±10%. The conductive alloy preform may be a nickel-iron alloy (e.g., Alloy 42) or a silver copper (Ag—Cu) alloy as described herein. The conductive alloy preform, also referred to herein as braze, may be in sheet form that is cut to fit the configuration of the flange and/or insulator. In some embodiments, the preform is a lead frame made of Alloy 42, a material available in sheet form, which is then cut to form the lead frame. In some instances, the preform 130 is nickel plated to enhance bonding.

The aforementioned process eliminates the need for lengthy repeated plating baths and sintering cycles as these cycles are replaced with a single deposition coating process for each component surface. And, importantly, assemblies formed by this process are advantageously devoid of organics, trapped gasses, and/or voids; and thereby, demonstrate excellent adhesion properties and RF performance. This process allows for the brazing of the conductive alloy preform to the flange and insulator without techniques that introduce outgassing and organics that are deleterious to semiconductors.

A process for attaching leads to a microelectronics package assembly is described. The process includes mounting an insulator on a flange, such as flange 120 described herein. The insulator, such as insulator 150 described herein, includes an upper surface. The process includes depositing a coating on a portion of the upper surface of the insulator to a thickness of less than or equal to 1 micron. Depositing the coating onto the upper surface is performed selectively to coat only and precisely the portions of the upper surface of the insulator that are to subsequently contact leads, interconnects, or a die. Selectively coating may include masking the portion(s) of the upper surface of the insulator that are not desired to be coated. Side surfaces of the insulator, such as faces 146 as in FIG. 8, are also masked. Depositing a coating on a portion of the upper surface of the insulator may include one or more sublayers as described above, in other words, a first sublayer, e.g., titanium, and a second sublayer, e.g., copper. Depositing a coating on the portion of the insulator upper surface includes deposition techniques as previously described, such as PVD.

The process includes directly bonding one or more leads, such as leads 172 described herein, onto the insulator coated upper surface. The deposited coating allows for at least one of the one or more leads to have a width of less than or equal to 0.35 microns. This process importantly allows for the narrowing of the width of the leads, which improves R values. The directly bonding includes positioning a conductive alloy preform, such as conductive alloy preform 160 described herein, for adhering the one or more leads to the insulator. Positioning includes contacting the conductive alloy preform to the insulator coated upper surface and to the one or more leads. The process may include cutting the conductive alloy preform to size and pattern desired. The preform may have a thickness of from 0.01 to 0.05 mm, e.g., 0.025 mm 10%. The conductive alloy preform may be a silver copper (Ag—Cu) alloy as described herein.

The aforementioned process enables for complicated circuitry patterns to be applied to the insulator. This is because coating of the insulator upper surface via a single deposition process as described allows for tighter tolerances in the coating pattern over previous techniques such as repeated plating baths and sintering cycles. The deposited coating may be applied to the exact width desired. Previous techniques required the user to factor in for shrinkage during sintering in the repeated plating baths and sintering cycles. Previous techniques also introduced an excess amount of conductive alloy preform, resulting in undesired dendritic growth that could shorting between the leads. The depositing of the coating herein selectively and minimally metallizes a desired area with a patterned coating on the insulator upper surface. The metallized portion of the upper surface of the present insulator maintains integrity, as shrinkage will not occur affecting pattern precision due to the absence of sintering steps. In addition, the coating of the insulator upper surface as described herein is of a thickness of less than or equal to 1 micron. Previous techniques required greater coating thicknesses and thus leads having a width of less than or equal to 0.35 microns were simply not obtainable. Narrower leads are not possible with the conventional techniques, such as repeated plating baths and sintering cycles or paste application. Packages according the processes herein accommodate narrower leads while producing high yield.

The processes herein may include alternatives to selectively coating and/or masking portion(s) of the upper surface of the insulator as described above. Specifically, deposited coating(s), e.g., by PVD, can be applied over the entirety of the upper surface of the insulator. These coatings may further include gold and/or nickel and/or palladium platings thereon. Then, utilizing laser removal, the coating(s) are selectively removed for circuit formation. Laser removal of the deposited coatings allows for very tight tolerances to form thin RF lines as required for high performance applications, e.g., telecommunication 5G technologies.

A process for covering a microelectronics package assembly is described. The process includes mounting an insulator (such as insulator 150 described herein) on a flange (such as flange 120 described herein). A die, such as die 195 as described herein, may be mounted on the flange or the insulator, and the insulator may partially enclose the die. Mounting a die to the insulator (or in alternative configurations onto the flange) may include bonding, or otherwise attaching, a die, e.g., GaN. For example, mounting the die may include welding with an Au—Sn alloy. As described below, mounting a die may be performed after adhering the first and second conductive preforms in a brazing treatment or after attaching a cover. In some embodiments, the second conductive preform and/or the lead frame may be a silver-copper alloy such as Ag72Cu28 (72 wt % Ag and 28 wt % Cu).

The process includes forming a lead frame including a plurality of leads configured to surround the die on the surface of the insulator opposing the flange. The leads, such as leads 172 described herein, may include a nickel-iron alloy having from 30 to 80 wt. % nickel, e.g., from 35 to 80 wt. % nickel, with minors amounts of copper, manganese, chromium, aluminum, silicon, and/or molybdenum, of less than 1 wt. %, and the balance being iron. Advantageously, the leads may have a narrow width of less than or equal to 0.35 microns.

The process includes forming a cavity for the die by adhering a liquid crystal polymer cover to the lead frame by a non-conductive adhesive. The aforementioned process advantageously enables the use of LCP for covering the microelectronics package assembly. The inclusion of glass particulates, e.g., fibers or beads, elevates the melting temperature within the LCP allowing the LCP cover to be used at higher temperatures than polymers without such additions. LCP covers, therefore, replace ceramic covers and thus provide advantages over ceramic covers that can experience microcracks and even failure with heat and thermal expansion. In addition, LCP covers demonstrate excellent compatibility for bonding with non-conductive adhesives, e.g., epoxies, resulting in stronger bonds. The flexibility of the LCP cover contributes to successfully analyzing for Failure Analysis. Unlike ceramic covers, LCP covers are removable or detachable without damaging the semiconductor chip, e.g. die, within the package assembly, thus allowing for accurate failure analysis.

Alternative to an LCP cover as described above, the process may include a KOVAR® ring enclosure and a ceramic etch lid for fine leak safe hermetic sealing of the assembly. The KOVAR® ring may be formed from a KOVAR® sheet. The KOVAR® ring may be Ni/Au plated or Ni/Au/Ni/Au plated or palladium plated.

The process may also include a shim or riser within the assembly, for example the shim may be positioned within an opening of an insulator ring. Depositing coating(s) onto the shim, which may be CuW, may include PVD coatings such as described above. The shim may be further Ni/Au plated or Ni/Au/Ni/Au plated or palladium plated. The shim may be utilized to provide a pedestal for which a die may be positioned within the assembly.

Another process for making a microelectronics package assembly is described. The process includes depositing a first coating having a thickness of less than or equal to 1 micron on opposing surfaces of a flange and an insulator, such as insulator 150 as described. The flange, such as flange 120 as described, is a high thermal conductive material having a thermal conductivity ranging from 140 to 2000 W/(mK) at room temperature and a coefficient of thermal expansion (CTE) ranging from 2.3 ppm/K to 17.5 ppm/K. Depositing the coatings onto the flange and insulator may include deposition techniques as described, such as PVD. The coatings on each of the upper surface of the flange (e.g., coating 125) and the bottom surface of the insulator (e.g., coating 145) may include one or more sublayers, in other words, a first sublayer, e.g., titanium, and a second sublayer, e.g., copper. In some embodiments, the process includes depositing a coating onto the flange upper surface and/or the insulator bottom surface with a first sublayer of titanium, which may be from 15% to 35% of the flange coating thickness, and depositing a second sublayer of copper on top of the first sublayer, where the sublayer of copper is 65% to 85% of the flange coating thickness. The process includes positioning a first conductive alloy preform between the coated surfaces of the flange and the insulator for adhering the flange to the insulator. The first conductive alloy preform, such as preform 130 as described, is for adhering the insulator to the flange. The first conductive alloy preform contacts the coated flange upper surface and the coated insulator bottom surface. The process may include cutting the first conductive alloy preform to size and pattern desired. The preform may have a thickness of from 0.01 to 0.05 mm, e.g., 0.025 mm±10%.

The process includes depositing another coating on a portion of the upper surface of the insulator to a thickness of less than or equal to 1 micron to form a partially coated upper surface (e.g., coating 155). As described above for depositing coatings onto the flange upper surface and the insulator bottom surface, depositing a coating on a portion of the upper surface of the insulator may include deposition techniques as described, such as PVD. Depositing a coating on a portion of the upper surface of the insulator may include one or more sublayers, similarly as described above.

The process includes directly bonding one or more leads to the partially coated upper surface using a second conductive alloy preform to allow the one or more leads to have a narrow width of less than or equal to 0.35 microns. The leads, such as leads 172 as described, may be part of a lead frame and may surround the die on the coated surface of the insulator opposing the flange. The leads 172 may include a nickel-iron alloy having from 30 to 80 wt. % nickel, e.g., from 35 to 80 wt. % nickel, with minors amounts of copper, manganese, chromium, aluminum, silicon, and/or molybdenum, of less than 1 wt. %, and the balance being iron. In preferred embodiments, the leads comprises a nickel-iron alloy etched to size, where the alloy is Alloy 42 and/or Alloy 52. The second conductive alloy preform, such as preform 160 as described, is for adhering the lead frame to the insulator. The second conductive alloy preform contacts the coated insulator upper surface and the plurality of leads. The process may include cutting the second conductive alloy preform to size and pattern desired. The preform may have a thickness of from 0.01 to 0.05 mm, e.g., 0.025 mm±10%.

The process includes adhering the first conductive preform to the insulator and the flange and the second conductive preform to the insulator and the leads at a temperature of greater than or equal to 850° C. Adhering may include a brazing treatment, wherein the assembly is heated in a furnace to bond the surfaces contacted to the conductive alloy preforms. The brazing treatment simultaneously bonds the insulator to the leads and the insulator to the flange. The brazing treatment may be performed in a belt furnace for manufacturing efficiency, or alternatively in box furnaces. Additionally, the brazing treatment may penetrate any through holes, or vias, a plurality of which may be formed with a laser through the thickness of the insulator. The braze enhances bonding of the insulator to other components within the assembly.

The process includes attaching a cover comprising a liquid crystal polymer to form a cavity for a die. Alternatively the cover may include a KOVAR® ring and ceramic etch lid cover as described. The cover, such as cover 190 (or 490) described herein, is adhered to the lead frame by a non-conductive adhesive, such as non-conductive adhesive 180 as described, cut to size or by a Au80Sn20 frame for a KOVAR® ring, e.g., 80 wt % gold and 20 wt % tin. The Au80Sn20 may also be used as a preform for shim attachment to the flange. Attaching a cover with the non-conductive adhesive may be performed at a temperature of less than or equal to 180° C., and thus does not affect any of the other package assembly components. The process may further include mounting a die to the insulator (or to a flange in alternative configurations). Specifically, GaN dies are resistant to attachment in prior packaging methods relying on nickel plating/sintering techniques. GaN does not bond to nickel. In one embodiments, the process includes welding the GaN onto the coated insulator upper surface with an Ag—Sn alloy.

Figure 24:
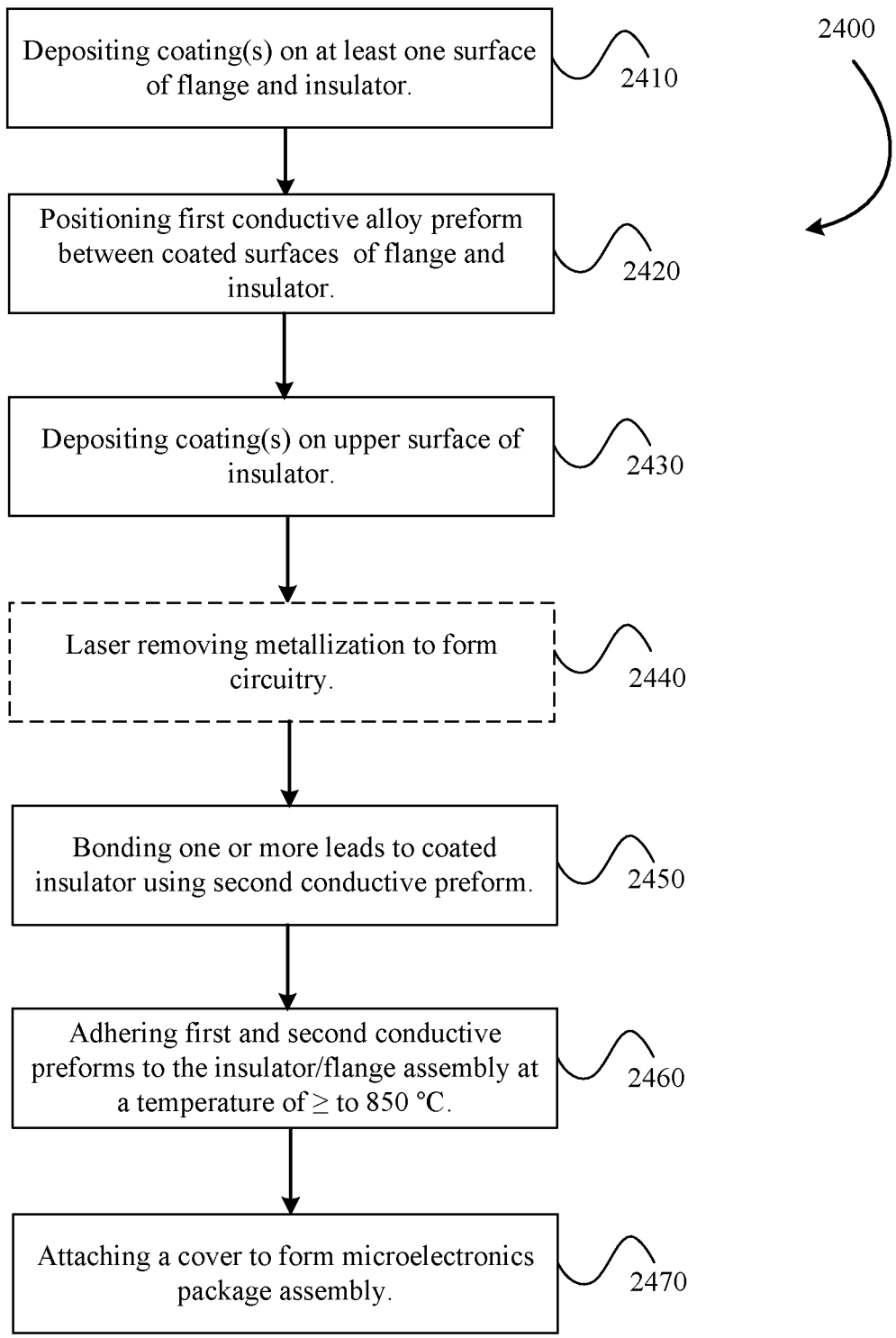
FIG. 24 illustrates a process flow chart according to embodiments herein.

FIG. 24 illustrates a flow chart according to an exemplary process, process 2400, of making a microelectronics package assembly. Depositing coating(s) 2410 is performed on at least one surface of a flange and at least one surface of an insulator. The flange may be CPC or other suitable material as described herein, and the insulator may be alumina or other suitable material as described herein. The coatings may be deposited by PVD to metallize the upper surface of the flange and the bottom surface of the insulator. The coatings may be titanium and/or copper as described herein.

Positioning 2420 a first conductive alloy preform, e.g., a lead frame of Alloy 42, between coated surfaces of flange and insulator is performed to form a flange/insulator subassembly. Further depositing coating(s) 2430 on upper surface of insulator is made selectively or alternatively over the entirety of the upper surface of the insulator. Optionally, laser removing 2440 the metallization forms circuitry as desired. Bonding 2450 one or more leads to the coated insulator is performed using a second conductive preform. Optionally, the insulator includes laser formed through holes and brazing the insulator includes penetrating the through holes to bond the insulator to the flange. Adhering 2560 first and second conductive preforms to the insulator/flange assembly is performed at a temperature of greater than or equal to 850° C., e.g., 850° C., 875° C., or 900° C. Attaching 2570 a cover to form microelectronics package assembly. The cover may be LCP or KOVAR® ring and ceramic etch lid cover as described above. The process optionally includes positioning a die within the assembly and hermetically sealing the assembly.

The aforementioned processes advantageously include assemblies demonstrating high RF performance and excellent adhesion properties, while enabling complicated circuitry and an LCP cover or alternatively a cover including KOVAR® ring and ceramic lid to complete the microelectronics package assembly. The aforementioned processes also provide package assemblies suitable for mounting GaN dies, thus improving performance over Si dies by a factor of from two-fold to six-fold. The processes are suitable for ever-decreasing architecture sizes in packaging, and thus also provide higher performance with less volume and/or weight of packaging.

Microelectronics Package Assembly Configurations

In one aspect, a microelectronics package assembly comprises a flange having an upper surface, wherein the flange is a high thermal conductive material having a thermal conductivity ranging from 140 to 2000 W/(mK) at room temperature and a coefficient of thermal expansion (CTE) ranging from 2.3 ppm/K to 17.5 ppm/K; a first coating disposed on the upper surface having a thickness of less than or equal to 1 micron; an insulator for partially enclosing and mounting a die, the insulator having a having a bottom surface, a second coating disposed on the bottom surface of the insulator; and a conductive alloy preform for adhering the insulator to the flange, wherein the conductive alloy preform contacts the first and second coatings. This configuration provides a flange/insulator assembly useful for microelectronics package assemblies. While not being limited thereto, this configuration, for example, can include a CPC flange deposited (on the upper surface) with a first PVD coating of titanium and copper (less than 1 micron) and assembled with an alumina insulator deposited (on the bottom surface) with a similar second PVD coating of titanium and copper (less than 1 micron). A (first) preform of Alloy 42 that has been nickel plated is positioned between the upper surface of the flange and the bottom surface of the insulator. The flange/insulator assembly is adhered at a temperature of greater than or equal to 850° C.

In another aspect, a microelectronics package assembly comprising: a flange having an insulator mounted thereon, the insulator having an upper surface, a first coating disposed on the upper surface of the insulator having a thickness of less than or equal to 1 micron; one or more leads, wherein at least one of the one or more leads has a width of less than or equal to 0.35 microns; and a conductive alloy preform for adhering the one or more leads to the insulator, wherein the conductive alloy preform contacts the first coating and the one or more leads. This configuration provides a flange/insulator/leads assembly useful for microelectronics package assemblies. While not being limited thereto, this configuration, for example in combination with the above configuration, includes a (third) PVD coating of titanium and copper (less than 1 micron) deposited onto the insulator upper surface. Another (second) preform is positioned atop the insulator surface to include a silver-copper frame and/or preform for a plurality of leads. Advantageously, the distance between the leads is minimized for greater RF performance. As understood, the above configurations can be provided as such for subsequent mounting of a die.

In another aspect, a microelectronics package assembly comprising: a flange having an insulator and a die mounted thereon, wherein the insulator partially encloses the die; a lead frame including a plurality of leads surrounding the die on the surface of the insulator opposing the flange; and a cover comprising a liquid crystal polymer to form a cavity for the die, wherein the cover is adhered to the lead frame by a non-conductive adhesive. This configuration provides an microelectronics package assembly in which a die is mounted and covered. Alternatively, the assembly and cover can be provided for subsequent mounting of a die. Adaptable to customer needs, the cover may be hermetically sealed for fine leak safety. Alternatively, gross leak safe cover and sealing may be employed.

In yet another aspect, a microelectronics package assembly comprising: a flange having an upper surface, wherein the flange is a high thermal conductive material having a thermal conductivity ranging from 140 to 2000 W/(mK) at room temperature and a coefficient of thermal expansion (CTE) ranging from 2.3 ppm/K to 17.5 ppm/K; a first coating disposed on the upper surface of the flange having a thickness of less than or equal to 1 micron; an insulator for partially enclosing and mounting a die, the insulator having a bottom surface opposing the flange and an upper surface, a second coating disposed on the bottom surface of the insulator having a thickness of less than or equal to 1 micron; a first conductive alloy preform for adhering the insulator to the flange, wherein the conductive alloy preform contacts the first and second coatings, a third coating disposed on a portion of the upper surface of the insulator having a thickness of less than or equal to 1 micron, where the third coating is the same as the second coating; a lead frame including a plurality of leads configured to surround the die on the upper surface of the insulator; a second conductive alloy preform for adhering the lead frame to the insulator, wherein the second conductive alloy preform contacts the third coating and the plurality of leads; and a cover comprising a liquid crystal polymer to form a cavity for the die, wherein the cover is adhered to the lead frame by a non-conductive adhesive.

In a preferred aspect, a microelectronics package assembly comprising: a flange having an upper surface; a first coating disposed on the upper surface of the flange; an insulator for partially enclosing a die, the insulator having a bottom surface for mounting onto the flange and an upper surface opposite the bottom surface, a second coating disposed on the bottom surface of the insulator and a third coating disposed on the upper surface of the insulator, wherein the first coating, the second coating, and the third coating each have a thickness of less than or equal to 1 micron, and wherein at least one of the first coating, the second coating, and the third coating is applied via at least one of physical vapor deposition, atomic deposition, or chemical deposition. This configuration provides a complete assembly useful for microelectronics package assemblies for subsequent mounting of a die. While not being limited thereto, this configuration, can include a CPC flange deposited (on the upper surface) with a first PVD coating of titanium and copper (less than 1 micron) and assembled with an alumina insulator deposited (on the bottom surface) with a similar second PVD coating of titanium and copper (less than 1 micron). A (first) preform of Alloy 42 that has been nickel plated is positioned between the upper surface of the flange and the bottom surface of the insulator. The flange/insulator assembly is adhered at a temperature of greater than or equal to 850° C. This configuration includes a (third) PVD coating of titanium and copper (less than 1 micron) deposited onto the insulator upper surface. The third coating is deposited over the entire upper surface of the insulator and then selectively the third coating is removed using a laser. Another (second) preform is positioned atop the insulator surface to include a silver-copper frame and/or preform for a plurality of leads. Advantageously, the distance between the leads is minimized for greater RF performance. The insulator can be a ceramic ring having an opening and the opening accommodates an optional CuW shim that has a (fourth) PVD coating of titanium and copper (less than 1 micron) deposited onto the upper surface of the shim. A KOVAR® ring is positioned atop the upper surface of the insulator ceramic ring having the third coating. The assembly is nickel plated and sealed using a gold-tin (Au80Sn20) frame for the KOVAR® ring as well as a gold-tin (Au80Sn20) preform for the CuW shim Au80Sn20. A ceramic etch lid, which is Ni/Au plated covers the assembly. Laser removal is further used to clean up any excess (plating and/or coating) prior to hermetically sealing with optionally a die mounted therein.

Any of the configurations above may include that the flange is a high thermal conductive material having a thermal conductivity ranging from 140 to 650 W/(mK) at room temperature and a CTE ranging from 5.5 ppm/K to 17.5 ppm/K. In some embodiments, the flange is a high thermal conductive material having a thermal conductivity ranging from 140 to 400 W/(mK) at room temperature and a CTE ranging from 5.5 ppm/K to 17.5 ppm/K or is a high thermal conductive material having a thermal conductivity ranging from 500 to 600 W/(mK) at room temperature and a CTE ranging from 6.0 ppm/K to 10.5 ppm/K. Suitable flange materials include a diamond based composite, Cu—CuMo—Cu (CPC), copper tungsten (CuW), Cu—Mo—Cu (CMC), Cu, or combinations thereof. As in some of the examples above, the flange is Cu—CuMo—Cu (CPC). In other examples, the flange includes a copper diamond composite or a silver diamond composite.

Any of the configurations above may include that at least one of the first and second coatings includes titanium, copper, alloys thereof, or combinations thereof. At least one of the first and second coatings is applied via physical vapor deposition (PVD). The first and second deposited coatings are devoid of nickel.

Any of the configurations above may include at least one of the first and second conductive alloy preforms is a solder alloy. At least one of the first and second conductive alloy preforms is a silver copper (Ag—Cu) alloy or a gold tin (Au—Sn) alloy.

Any of the configurations above may include that the insulator includes sapphire, alumina ($Al_2O_3$), beryllia (BeO), aluminum nitride (AlN), zirconia toughened alumina (ZTA), silicon carbide (SiC), magnesium silicon carbide (Mg—SiC), silicon nitride (Si$_3$N$_4$), or combinations thereof. As in some of the examples above, the insulator is alumina (Al$_2$O$_3$) having a purity of greater than or equal to 96%.

Any of the configurations above may include that the insulator includes a plurality of through holes through a thickness of the insulator. The plurality of through holes can be configured in a pattern along a peripheral area of the insulator.

Optionally, the insulator as in any of the configurations above further includes a nickel plate over the coated bottom and upper surfaces, the nickel plate having a thickness of from 1.0 to 3.5 microns.

One or more leads as in any of the configurations above include an alloy of iron, nickel, or combinations thereof. In some examples above, the one or more leads include an alloy having a chemical composition of from 30 wt % to 80 wt % nickel (Ni) and balance iron (Fe). The one or more leads can have a thermal conductivity ranging from 9.5 W/(mK) to 11.5 W/(mK). Any of the configurations above may include that at least two of the one or more leads has a spacing distance of less than or equal to 0.35 microns.

Any of the configurations above may include a cover to form a cavity for the die. The cover can be alumina (Al$_2$O$_3$), aluminum nitride (AlN), liquid crystal polymer (LCP), or combinations thereof. The cover can include a non-conductive adhesive configured to provide a seal. For hermetic sealing the cover is ceramic, e.g., alumina (Al$_2$O$_3$) or aluminum nitride (AlN), and is sealed using a gold tin frame with a KOVAR® ring.

Any of the configurations above may include a die mounted therein or configured for subsequent mounting of a die. The die can include gallium nitride (GaN), gallium arsenide (GaAs), silicon (Si), or combinations thereof.

EXAMPLES

Dimensional Testing was performed for microelectronics package assemblies made according to process 2400 above and the results are summarized in Table 1.

TABLE 1

Dimensional Testing of Components

| Component | Composition | Dimensional Check |
|---|---|---|
| CPC Flange | Cu-CuMo-Cu: 1:4:1 | PASS |
| Ceramic Ring | 96% Al$_2$O$_3$ | PASS |
| Lead Frame | Alloy42 | PASS |
| Shim | Cu15W85 | PASS |
| KOVAR ® Ring | KOVAR ® | PASS |
| AuGe Frame | Au88Ge12 | PASS |
| Etch Lid | KOVAR ® | PASS |
| Nickel Plating Thickness | 4.23 μm | |
| Gold Plating Thickness | 3.23 μm | |

As shown in Table 1, all components passed the dimensional testing, which were checks prior to assembly. Tests included utilizing scanning electron microscopy with energy dispersive X-ray spectroscopy (SEM/EDX) and X-ray fluorescence (XRF) for plating thickness checks.

Functional Testing was performed for the package assemblies. The functional testing included leak test for cross-leak test range, lead peel tests for shear testing from 1,000 g to 5,000 g, conductivity tests using an Ohm meter to test for connections that are shorted or discontinuous, and solderability tests by dipping into solder pot to check the wetness.

TABLE 2

Functional Testing

| | | |
|---|---|---|
| Baked-Out Test | PASS | 420° C. at 5 minutes |
| Leak Test | PASS | Only applicable to Ceramic attached to CPC Flange |
| Lead Peel | PASS | |
| Conductivity Test | PASS | |
| Solderability Test | PASS | |

As shown in Table 2, the package assemblies passed all functional tests.

Embodiments

The following embodiments are contemplated. All combinations of features and embodiments are contemplated.

Embodiment 1: a microelectronics package assembly comprising: a flange having an upper surface; a first coating disposed on the upper surface of the flange; an insulator for partially enclosing a die, the insulator having a bottom surface for mounting onto the flange and an upper surface opposite the bottom surface, a second coating disposed on the bottom surface of the insulator and a third coating disposed on the upper surface of the insulator, wherein the first coating, the second coating, and the third coating each have a thickness of less than or equal to 1 micron, and wherein at least one of the first coating, the second coating, and the third coating is applied via at least one of physical vapor deposition, atomic deposition, or chemical deposition.

Embodiment 2: the assembly of any previous or subsequent embodiment, wherein at least one of the first coating, the second coating, and the third coating includes titanium, copper, alloys thereof, sublayers thereof, or combinations thereof.

Embodiment 3: the assembly of any previous or subsequent embodiment, wherein each of the first coating, the second coating, and the third coating are devoid of nickel.

Embodiment 4: the assembly of any previous or subsequent embodiment, wherein the insulator includes sapphire, alumina (Al$_2$O$_3$), beryllia (BeO), aluminum nitride (AlN), zirconia toughened alumina (ZTA), silicon carbide (SiC), magnesium silicon carbide (Mg—SiC), silicon nitride (Si$_3$N$_4$), or combinations thereof.

Embodiment 5: the assembly of any previous or subsequent embodiment, wherein the insulator is alumina (Al$_2$O$_3$) having a purity of greater than or equal to 96%.

Embodiment 6: the assembly of any previous or subsequent embodiment, wherein the insulator includes a plurality of through holes through a thickness of the insulator, and wherein a braze layer onto the upper surface of the insulator penetrates the through holes to bond the insulator to the flange.

Embodiment 7: the assembly of any previous or subsequent embodiment, wherein the flange is a high thermal conductive material having a thermal conductivity ranging from 140 to 2000 W/(mK) at room temperature and a coefficient of thermal expansion (CTE) ranging from 2.3 ppm/K to 17.5 ppm/K.

Embodiment 8: the assembly of any previous or subsequent embodiment, wherein the flange includes a diamond based composite, Cu—CuMo—Cu (CPC), copper tungsten (CuW), Cu—Mo—Cu (CMC), Cu, or combinations thereof.

Embodiment 9: the assembly of any previous or subsequent embodiment, further comprising a first conductive alloy preform for adhering the insulator to the flange, wherein the first conductive alloy preform contacts the first coating and the second coating.

Embodiment 10: the assembly of any previous or subsequent embodiment, further comprising one or more leads, wherein at least one of the one or more leads has a width of less than or equal to 0.35 microns, and a second conductive alloy preform for adhering the one or more leads to the insulator, wherein the second conductive alloy preform contacts the third coating and the one or more leads.

Embodiment 11: the assembly of any previous or subsequent embodiment, wherein at least one of the first and second conductive alloy preforms is a silver copper (Ag—Cu) alloy or a gold tin (Au—Sn) alloy.

Embodiment 12: the assembly of any previous or subsequent embodiment, wherein the one or more leads include at least one of: an alloy having a chemical composition of from 30 to 80 wt % nickel (Ni) and balance iron (Fe), a thermal conductivity ranging from 9.5 W/(mK) to 11.5 W/(mK), and a spacing distance between at least two of the one or more leads of less than or equal to 0.35 microns.

Embodiment 13: the assembly of any previous or subsequent embodiment, further comprising a cover to form a cavity with the insulator for partially enclosing the die.

Embodiment 14: the assembly of any previous or subsequent embodiment, wherein the cover is alumina ($Al_2O_3$), aluminum nitride (AlN), liquid crystal polymer (LCP), or combinations thereof.

Embodiment 15: a process for making a microelectronics package assembly, the process comprising: depositing a first coating having a thickness of less than or equal to 1 micron on opposing surfaces of a flange and an insulator, wherein the flange is a high thermal conductive material having a thermal conductivity ranging from 140 to 2000 W/(mK) at room temperature and a coefficient of thermal expansion (CTE) ranging from 2.3 ppm/K to 17.5 ppm/K; positioning a first conductive alloy preform between the coated surfaces of the flange and the insulator; depositing a second coating on at least a portion of an upper surface of the insulator to a thickness of less than or equal to 1 micron to form at least a partially coated upper surface; directly bonding one or more leads to the at least partially coated upper surface using a second conductive alloy preform to allow the one or more leads to have a narrow width of less than or equal to 0.35 microns; adhering the first conductive preform to the insulator and the flange and the second conductive preform to the insulator and the leads at a temperature of greater than or equal to 850° C.; wherein depositing at least one of a first coating and a second coating includes physical vapor deposition, atomic deposition, or chemical deposition.

Embodiment 16: the process of any previous or subsequent embodiment, wherein the first coating comprises titanium, copper, alloys thereof, sublayers thereof, or combinations thereof, and the second coating comprises titanium, copper, alloys thereof, sublayers thereof.

Embodiment 17: the process of any previous or subsequent embodiment, wherein depositing at least one of the first coating and the second coating includes depositing two or more sublayers, wherein a first sublayer is titanium and a second sublayer is copper, and wherein the first sublayer is from 15% to 35% of a total coating thickness and the second sublayer is from 65% to 85% of the total coating thickness.

Embodiment 18: the process of any previous or subsequent embodiment, further comprising attaching a cover to form a cavity for a die wherein the cover includes a liquid crystal polymer, wherein the cover is alumina ($Al_2O_3$), aluminum nitride (AlN), liquid crystal polymer (LCP), or combinations thereof.

Embodiment 19: the process of any previous or subsequent embodiment, further comprising forming a plurality of through holes through a thickness of the insulator prior to coating, and wherein after depositing a second coating the process includes brazing a layer onto the upper surface of the insulator to penetrate the through holes to bond the insulator to the flange.

Embodiment 20: the process of any previous or subsequent embodiment, wherein depositing a second coating includes depositing onto an entirety of the upper surface of the insulator and further includes laser removal of the second coating selectively to form circuitry.

Embodiment 21: a microelectronics package assembly comprising a flange having an upper surface, wherein the flange is a high thermal conductive material having a thermal conductivity ranging from 140 to 2000 W/(mK) at room temperature and a coefficient of thermal expansion (CTE) ranging from 2.3 ppm/K to 17.5 ppm/K; a first coating disposed on the upper surface having a thickness of less than or equal to 1 micron; an insulator for partially enclosing and mounting a die, the insulator having a having a bottom surface, a second coating disposed on the bottom surface of the insulator; and a conductive alloy preform for adhering the insulator to the flange, wherein the conductive alloy preform contacts the first and second coatings.

Embodiment 22: a microelectronics package assembly comprising: a flange having an insulator mounted thereon, the insulator having an upper surface, a first coating disposed on the upper surface of the insulator having a thickness of less than or equal to 1 micron; one or more leads, wherein at least one of the one or more leads has a width of less than or equal to 0.35 microns; and a conductive alloy preform for adhering the one or more leads to the insulator, wherein the conductive alloy preform contacts the first coating and the one or more leads.

Embodiment 23: a microelectronics package assembly comprising: a flange having an insulator and a die mounted thereon, wherein the insulator partially encloses the die; a lead frame including a plurality of leads surrounding the die on the surface of the insulator opposing the flange; and a cover comprising a liquid crystal polymer to form a cavity for the die, wherein the cover is adhered to the lead frame by a non-conductive adhesive.

Embodiment 24: a microelectronics package assembly comprising: a flange having an upper surface, wherein the flange is a high thermal conductive material having a thermal conductivity ranging from 140 to 2000 W/(mK) at room temperature and a coefficient of thermal expansion (CTE) ranging from 2.3 ppm/K to 17.5 ppm/K; a first coating disposed on the upper surface of the flange having a thickness of less than or equal to 1 micron; an insulator for partially enclosing and mounting a die, the insulator having a bottom surface opposing the flange and an upper surface, a second coating disposed on the bottom surface of the insulator having a thickness of less than or equal to 1 micron; a first conductive alloy preform for adhering the insulator to the flange, wherein the conductive alloy preform contacts the first and second coatings, a third coating disposed on a portion of the upper surface of the insulator having a thickness of less than or equal to 1 micron, where the third coating is the same as the second coating; a lead frame including a plurality of leads configured to surround the die on the upper surface of the insulator; a second conductive alloy preform for adhering the lead frame to the insulator, wherein the second conductive alloy preform contacts the third coating and the plurality of leads; and a cover comprising a liquid crystal polymer to form a cavity for the die, wherein the cover is adhered to the lead frame by a non-conductive adhesive.

Embodiment 25: a process for making a microelectronics package assembly, the process comprising: depositing a coating having a thickness of less than or equal to 1 micron on opposing surfaces of a flange and an insulator, wherein the flange is a high thermal conductive material having a thermal conductivity ranging from 140 to 2000 W/(mK) at room temperature and a coefficient of thermal expansion (CTE) ranging from 2.3 ppm/K to 17.5 ppm/K; positioning a conductive alloy preform between the coated surfaces of the flange and the insulator; and adhering the conductive alloy preform to the flange and the insulator at a temperature of greater than or equal to 850° C.

Embodiment 26: a process for attaching leads to a microelectronics package assembly, the process comprising: mounting an insulator on a flange, wherein the surface opposing the flange is an upper surface of the insulator, depositing a coating on a portion of the upper surface of the insulator to a thickness of less than or equal to 1 micron; and directly bonding one or more leads to the coated upper surface using a conductive alloy preform to allow the one or more leads to have a narrow width of less than or equal to 0.35 microns.

Embodiment 27: a process for covering a microelectronics package assembly, the process comprising: mounting an insulator on a flange, wherein a die is mounted to the flange or the insulator; forming a lead frame including a plurality of leads configured to surround the die on the surface of the insulator opposing the flange; and forming a cavity for the die by adhering a liquid crystal polymer cover to the lead frame by a non-conductive adhesive.

Embodiment 28: a process for making a microelectronics package assembly, the process comprising: depositing a first coating having a thickness of less than or equal to 1 micron on opposing surfaces of a flange and an insulator, wherein the flange is a high thermal conductive material having a thermal conductivity ranging from 140 to 2000 W/(mK) at room temperature and a coefficient of thermal expansion (CTE) ranging from 2.3 ppm/K to 17.5 ppm/K; positioning a first conductive alloy preform between the coated surfaces of the flange and the insulator; depositing a second coating on a portion of the upper surface of the insulator to a thickness of less than or equal to 1 micron to form a partially coated upper surface; directly bonding one or more leads to the partially coated upper surface using a second conductive alloy preform to allow the one or more leads to have a narrow width of less than or equal to 0.35 microns; adhering the first conductive preform to the insulator and the flange and the second conductive preform to the insulator and the leads at a temperature of greater than or equal to 850° C.; and attaching a cover comprising a liquid crystal polymer to form a cavity for a die, wherein the cover is adhered to the lead frame by a non-conductive adhesive.

Embodiment 29: the assembly of any previous or subsequent embodiment, wherein the flange is a high thermal conductive material having a thermal conductivity ranging from 140 to 650 W/(mK) at room temperature and a CTE ranging from 5.5 ppm/K to 17.5 ppm/K.

Embodiment 30: the assembly of any previous or subsequent embodiment, wherein the flange is a high thermal conductive material having a thermal conductivity ranging from 140 to 400 W/(mK) at room temperature and a CTE ranging from 5.5 ppm/K to 17.5 ppm/K.

Embodiment 31: the assembly of any previous or subsequent embodiment, wherein the flange is a high thermal conductive material having a thermal conductivity ranging from 500 to 600 W/(mK) at room temperature and a CTE ranging from 6.0 ppm/K to 10.5 ppm/K.

Embodiment 32: the assembly of any previous or subsequent embodiment, wherein the flange includes a diamond based composite, Cu—CuMo—Cu (CPC), copper tungsten (CuW), Cu—Mo—Cu (CMC), Cu, or combinations thereof.

Embodiment 33: the assembly of any previous or subsequent embodiment, wherein the flange includes Cu—CuMo—Cu (CPC), copper tungsten (CuW), Cu—Mo—Cu (CMC), Cu, or combinations thereof.

Embodiment 34: the assembly of any previous or subsequent embodiment, wherein the flange includes a copper diamond composite or a silver diamond composite.

Embodiment 35: the assembly of any previous or subsequent embodiment, wherein at least one of the first and second coatings includes titanium, copper, alloys thereof, or combinations thereof.

Embodiment 36: the assembly of any previous or subsequent embodiment, wherein at least one of the first and second coatings is applied via physical vapor deposition (PVD).

Embodiment 37: the assembly of any previous or subsequent embodiment, wherein the first and second coatings are devoid of nickel.

Embodiment 38: the assembly of any previous or subsequent embodiment, wherein at least one of the first and second conductive alloy preforms is a solder alloy.

Embodiment 39: the assembly of any previous or subsequent embodiment, wherein at least one of the first and second conductive alloy preforms is a silver copper (Ag—Cu) alloy or a gold tin (Au—Sn) alloy.

Embodiment 40: the assembly of any previous or subsequent embodiment, wherein the insulator includes sapphire, alumina ($Al_2O_3$), beryllia (BeO), aluminum nitride (AlN), zirconia toughened alumina (ZTA), silicon carbide (SiC), magnesium silicon carbide (Mg—SiC), silicon nitride ($Si_3N_4$), or combinations thereof.

Embodiment 41: the assembly of any previous or subsequent embodiment, wherein the insulator includes sapphire, alumina ($Al_2O_3$), aluminum nitride (AlN), or combinations thereof.

Embodiment 42: the assembly of any previous or subsequent embodiment, wherein the insulator is alumina ($Al_2O_3$) having a purity of greater than or equal to 96%.

Embodiment 43: the assembly of any previous or subsequent embodiment, wherein the insulator includes a plurality of through holes through a thickness of the insulator.

Embodiment 44: the assembly of any previous or subsequent embodiment, wherein the plurality of through holes are configured in a pattern along a peripheral area of the insulator.

Embodiment 45: the assembly of any previous or subsequent embodiment, wherein the insulator further includes a nickel plate over the coated bottom and upper surfaces, the nickel plate having a thickness of from 1.0 to 3.5 microns.

Embodiment 46: the assembly of any previous or subsequent embodiment, wherein the one or more leads include an alloy of iron, nickel, or combinations thereof.

Embodiment 47: the assembly of any previous or subsequent embodiment, wherein the one or more leads include an alloy having a chemical composition of from 30 to 80 wt % nickel (Ni) and balance iron (Fe).

Embodiment 48: the assembly of any previous or subsequent embodiment, wherein the one or more leads have a thermal conductivity ranging from 9.5 W/(mK) to 11.5 W/(mK).

Embodiment 49: the assembly of any previous or subsequent embodiment, wherein at least two of the one or more leads has a spacing distance of less than or equal to 0.35 microns.

Embodiment 50: the assembly of any previous or subsequent embodiment, further including a cover to form a cavity for the die.

Embodiment 51: the assembly of any previous or subsequent embodiment, wherein the cover is alumina ($Al_2O_3$), aluminum nitride (AlN), liquid crystal polymer (LCP), or combinations thereof.

Embodiment 52: the assembly of any previous or subsequent embodiment, wherein the cover includes a non-conductive adhesive configured to provide a seal.

Embodiment 53: the assembly of any previous or subsequent embodiment, wherein the die includes gallium nitride (GaN), gallium arsenide (GaAs), silicon (Si), or combinations thereof.

Embodiment 54: the process of any previous or subsequent embodiment, wherein depositing a coating includes physical vapor deposition, atomic deposition, or chemical deposition.

Embodiment 55: the process of any previous or subsequent embodiment, wherein depositing a coating includes physical vapor deposition.

Embodiment 56: the process of any previous or subsequent embodiment, wherein depositing a coating includes depositing two or more sublayers.

Embodiment 57: the process of any previous or subsequent embodiment, wherein a first sublayer is titanium and a second sublayer is copper.

Embodiment 58: the process of any previous or subsequent embodiment, wherein a first sublayer is 25%±10% of a total coating thickness and a second sublayer is 75%±10% of the total coating thickness.

Embodiment 59: the process of any previous or subsequent embodiment, wherein mounting includes the die is welded with an alloy of gold and tin.

While the invention has been described in detail, modifications within the spirit and scope of the invention will be readily apparent to those of skill in the art. In view of the foregoing discussion, relevant knowledge in the art and references discussed above in connection with the Background and Detailed Description, the disclosures of which are all incorporated herein by reference. In addition, it should be understood that aspects of the invention and portions of various embodiments and various features recited below and/or in the appended claims may be combined or interchanged either in whole or in part. In the foregoing descriptions of the various embodiments, those embodiments which refer to another embodiment may be appropriately combined with other embodiments as will be appreciated by one of skill in the art. Furthermore, those of ordinary skill in the art will appreciate that the foregoing description is by way of example only, and is not intended to limit.

We claim:

1. A microelectronics package assembly comprising:
    a flange having an upper surface, wherein the flange is a high thermal conductive material having a thermal conductivity ranging from 140 to 2000 W/(mK) at room temperature and a coefficient of thermal expansion (CTE) ranging from 2.3 ppm/K to 17.5 ppm/K;
    a first coating disposed on the upper surface of the flange;
    an insulator for partially enclosing a die, the insulator having a bottom surface for mounting onto the flange and an upper surface opposite the bottom surface,
    a second coating disposed on the bottom surface of the insulator and a third coating disposed on the upper surface of the insulator,
    wherein the first coating, the second coating, and the third coating each have a thickness of less than or equal to 1 micron, and wherein at least one of the first coating, the second coating, and the third coating is applied via at least one of physical vapor deposition, atomic deposition, or chemical deposition.

2. The microelectronics package assembly of claim 1, wherein at least one of the first coating, the second coating, and the third coating includes titanium, copper, alloys thereof, sublayers thereof, or combinations thereof.

3. The microelectronics package assembly of claim 1, wherein each of the first coating, the second coating, and the third coating are devoid of nickel.

4. The microelectronics package assembly of claim 1, wherein the insulator includes sapphire, alumina ($Al_2O_3$), beryllia (BeO), aluminum nitride (AlN), zirconia toughened alumina (ZTA), silicon carbide (SiC), magnesium silicon carbide (Mg—SiC), silicon nitride ($Si_3N_4$), or combinations thereof.

5. The microelectronics package assembly of claim 4, wherein the insulator is alumina ($Al_2O_3$) having a purity of greater than or equal to 96%.

6. The microelectronics package assembly of claim 1, wherein the insulator includes a plurality of through holes through a thickness of the insulator, and wherein a braze layer onto the upper surface of the insulator penetrates the through holes to bond the insulator to the flange.

7. The microelectronics package assembly of claim 1, wherein the flange includes a diamond based composite, Cu—CuMo—Cu (CPC), copper tungsten (CuW), Cu—Mo—Cu (CMC), Cu, or combinations thereof.

8. The microelectronics package assembly of claim 1, further comprising a first conductive alloy preform for adhering the insulator to the flange, wherein the first conductive alloy preform contacts the first coating and the second coating.

9. The microelectronics package assembly of claim 8, further comprising one or more leads, wherein at least one of the one or more leads has a width of less than or equal to 0.35 microns, and a second conductive alloy preform for adhering the one or more leads to the insulator, wherein the second conductive alloy preform contacts the third coating and the one or more leads.

10. The microelectronics package assembly of claim 9, wherein at least one of the first and second conductive alloy preforms is a silver copper (Ag—Cu) alloy or a gold tin (Au—Sn) alloy.

11. The microelectronics package assembly of claim 9, wherein the one or more leads include at least one of:
    an alloy having a chemical composition of from 30 to 80 wt. % nickel (Ni) and balance iron (Fe),
    a thermal conductivity ranging from 9.5 W/(mK) to 11.5 W/(mK), and
    a spacing distance between at least two of the one or more leads of less than or equal to 0.35 microns.

12. The microelectronics package assembly of claim 1, further comprising a cover to form a cavity with the insulator for partially enclosing the die.

13. The microelectronics package assembly of claim 12, wherein the cover is alumina ($Al_2O_3$), aluminum nitride (AlN), liquid crystal polymer (LCP), or combinations thereof.

14. A process for making a microelectronics package assembly, the process comprising:

depositing a first coating having a thickness of less than or equal to 1 micron on opposing surfaces of a flange and an insulator, wherein the flange is a high thermal conductive material having a thermal conductivity ranging from 140 to 2000 W/(mK) at room temperature and a coefficient of thermal expansion (CTE) ranging from 2.3 ppm/K to 17.5 ppm/K;

depositing a second coating on at least a portion of an upper surface of the insulator to a thickness of less than or equal to 1 micron to form at least a partially coated upper surface;

wherein depositing at least one of a first coating and a second coating includes physical vapor deposition, atomic deposition, or chemical deposition.

15. The process of claim 14, wherein the first coating comprises titanium, copper, alloys thereof, sublayers thereof, or combinations thereof, and the second coating comprises titanium, copper, alloys thereof, sublayers thereof.

16. The process of claim 14, wherein depositing at least one of the first coating and the second coating includes depositing two or more sublayers, wherein a first sublayer is titanium and a second sublayer is copper, and wherein the first sublayer is from 15% to 35% of a total coating thickness and the second sublayer is from 65% to 85% of the total coating thickness.

17. The process of claim 14, further comprising attaching a cover to form a cavity for a die wherein the cover includes a liquid crystal polymer, wherein the cover is alumina ($Al_2O_3$), aluminum nitride (AlN), liquid crystal polymer (LCP), or combinations thereof.

18. The process of claim 14, further comprising forming a plurality of through holes through a thickness of the insulator prior to coating, and wherein after depositing a second coating the process includes brazing a layer onto the upper surface of the insulator to penetrate the through holes to bond the insulator to the flange.

19. The process of claim 14, wherein depositing a second coating includes depositing onto an entirety of the upper surface of the insulator and further includes laser removal of the second coating selectively to form circuitry.

20. The process of claim 14, further comprising positioning a first conductive alloy preform between the coated surfaces of the flange and the insulator, directly bonding one or more leads to the at least partially coated upper surface using a second conductive alloy preform to allow the one or more leads to have a narrow width of less than or equal to 0.35 microns, and adhering the first conductive preform to the insulator and the flange and the second conductive preform to the insulator and the leads at a temperature of greater than or equal to 850° C.

* * * * *